United States Patent [19]

Finet

[11] 4,097,797

[45] Jun. 27, 1978

[54] APPARATUS FOR TESTING ELECTRICAL CIRCUIT UNITS SUCH AS PRINTED CIRCUIT CARDS

[75] Inventor: Michel Finet, Soumagne, Belgium

[73] Assignee: Burroughs Corporation, Detroit, Mich.

[21] Appl. No.: 693,595

[22] Filed: Jun. 7, 1976

Related U.S. Application Data

[63] Continuation of Ser. No. 515,811, Oct. 17, 1974, abandoned.

[51] Int. Cl.² .................... G01R 15/12; G06F 11/00
[52] U.S. Cl. ............................... 324/73 R; 235/302
[58] Field of Search ............... 324/73 R; 235/153 AC

[56] References Cited

U.S. PATENT DOCUMENTS

| | | | |
|---|---|---|---|
| 3,302,109 | 1/1967 | Jones | 324/73 R |
| 3,581,074 | 5/1971 | Waltz | 324/73 R X |
| 3,614,608 | 10/1971 | Giedd | 324/73 R |
| 3,651,315 | 3/1972 | Collins | 324/73 R X |
| 3,673,397 | 6/1972 | Schaefer | 324/73 R X |

OTHER PUBLICATIONS

N. J. Gale, "A Computer Controlled Circuit Tester" Electronic Instrumentation Conference, Hobart, Australia, May 1972, pp. 80-82.

Krosner; S. P. et al., "Logic Card Tester" IBM Technical Disclosure Bulletin, vol. 14, No. 4, Sep. 1971, pp. 142-143.

Cargile; W. P., "A Computer—Controlled System for Testing Digital Logic Modules" Hewlett—Packard Journal, Mar. 1969, pp. 14-20.

*Primary Examiner*—John K. Corbin
*Assistant Examiner*—Rolf Hille
*Attorney, Agent, or Firm*—Benjamin J. Barish; Dale V. Gaudier; Kevin R. Peterson

[57] ABSTRACT

A system is described for testing electrical circuit units, particularly printed circuit cards having a plurality of plug-in connector terminals.

The testing system is first operated in the Generation Mode wherein it generates a reference test pattern produced from a series of test stimuli applied sequentially to a reference card, and stores the pattern in a bulk memory, the pattern being in the form of a series of words identified by the part number of the respective card and containing the test stimuli and the responses thereto from the reference card. To test a production card, the system is operated in the Test Mode, wherein the stored test pattern generated from the corresponding reference card is extracted from the bulk memory and the reference responses are compared in a GO, NO-GO testing operation with the actual responses produced when applying the same test stimuli to the production card.

The system includes a pair of flip-flops for each pin of the tested card, one flip-flop being connected to a circuit which reflects the actual response of the pin to the test stimulus during the Test Mode, and the other flip-flop being connected to a circuit which reflects the reference reponse to the test stimulus as determined during the Generation Mode. The flip-flop pairs are disposed in a plurality of matrix cards each accommodating all the flip-flops of a group of pins (e.g., eight matrix cards each containing the flip-flop pairs for 25 pins, when testing a 200-pin card), providing a flexible modular arrangement easily enlargeable or alterable for testing other cards.

11 Claims, 21 Drawing Figures

(2 OF 200 PINS)

FIG.11 I/O W.C. READ TIMING
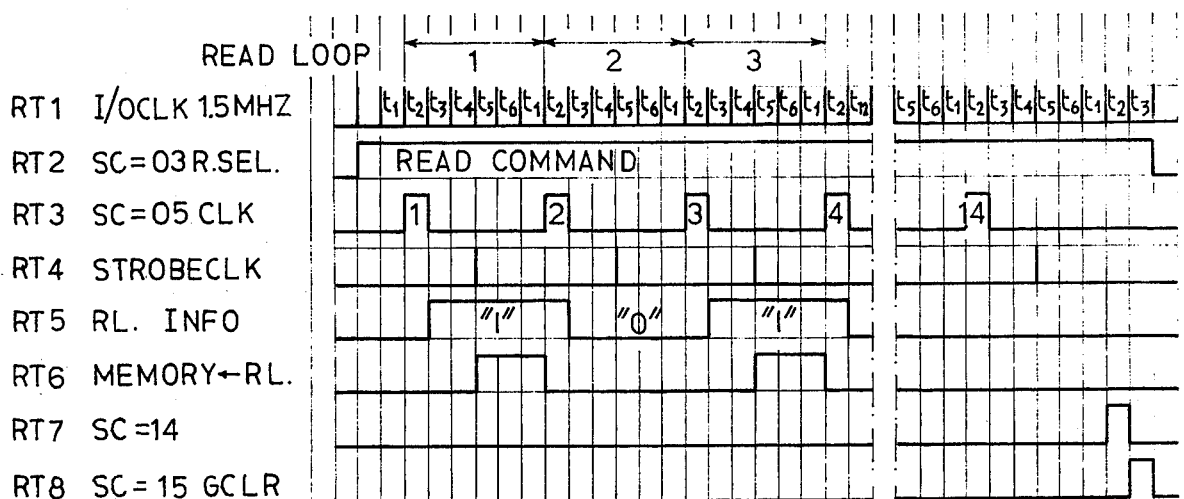
FIG.11a PART NUMBER READ TIMING
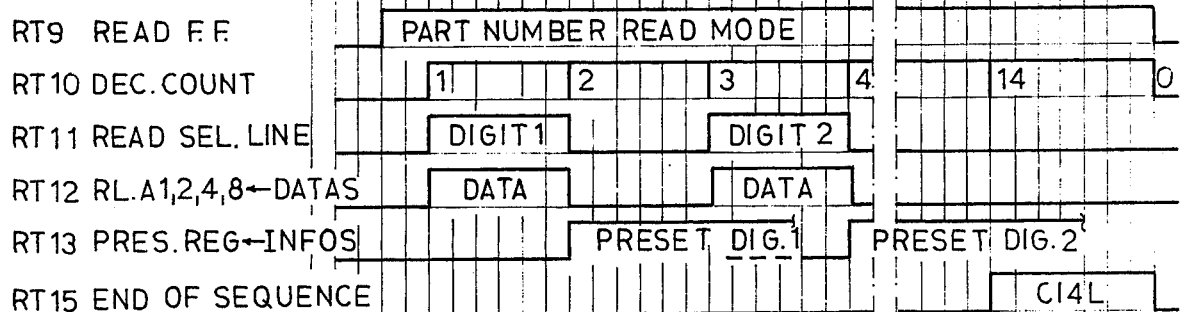
FIG.11b READ MATRIX TIMING
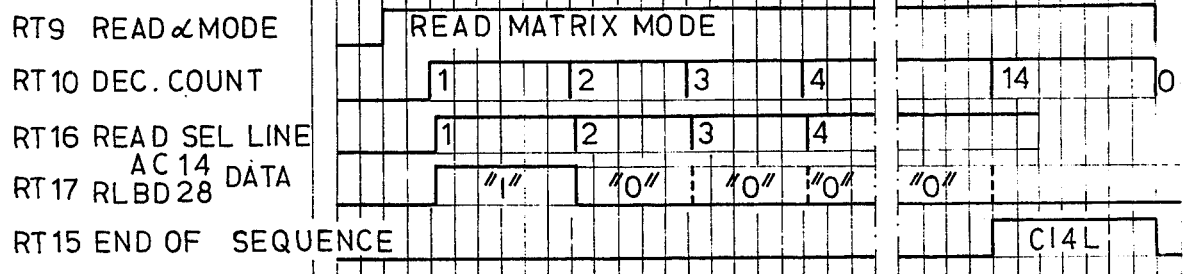

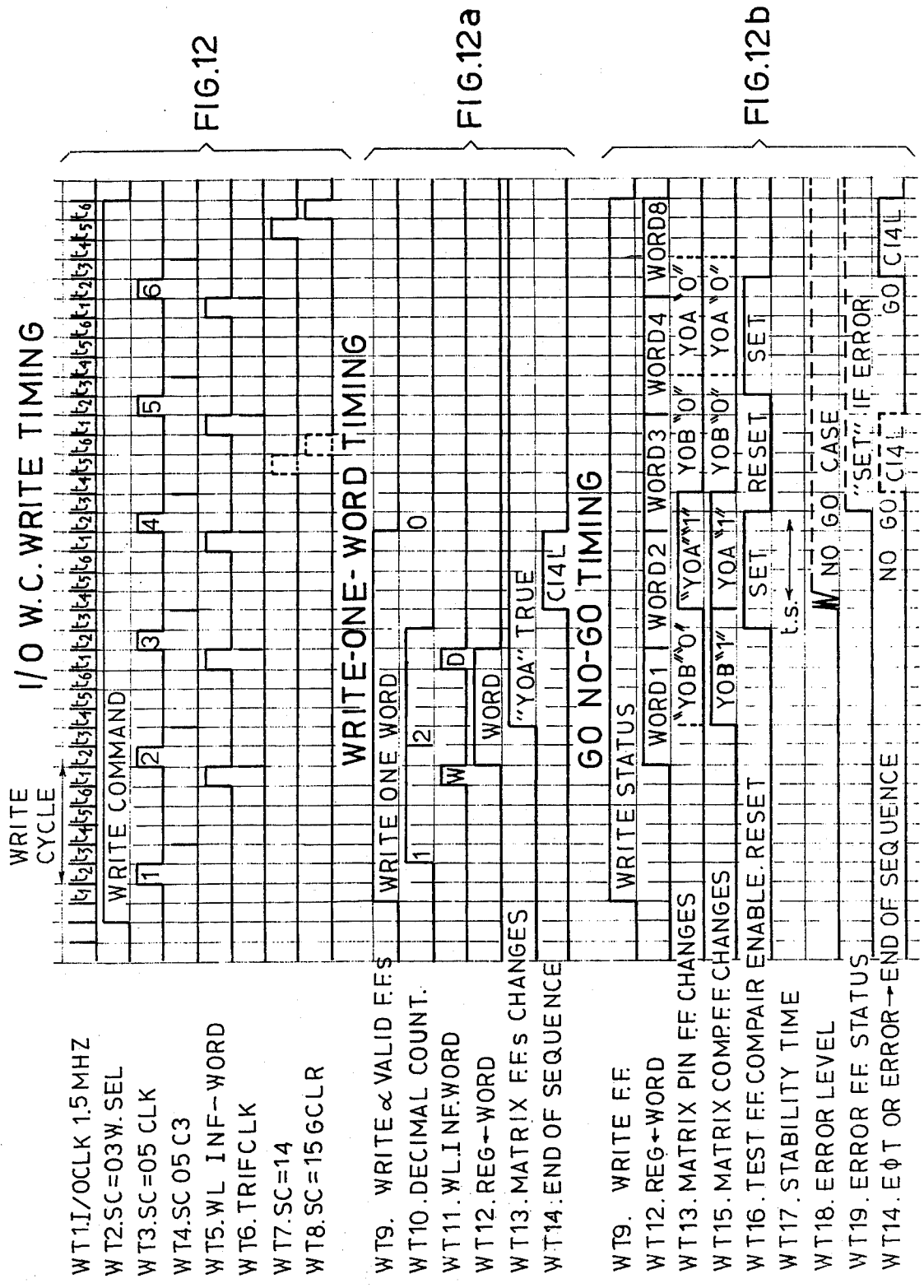

GENERATION FLOW

APPARATUS FOR TESTING ELECTRICAL CIRCUIT UNITS SUCH AS PRINTED CIRCUIT CARDS

This is a continuation of application Ser. No. 515,811, filed Oct. 17, 1974, now abandoned.

BACKGROUND OF THE INVENTION

The present invention relates to a method and apparatus for testing electrical circuit units having a plurality of connector terminals or pins, such as plug-in printed circuit cards commonly used in digital computers and other electronic devices.

Electrical apparatus, particularly electronic computers, are increasingly being constructed of a plurality of plug-in circuit units, such as printed circuit cards each carrying a number of integrated circuit chips. A common technique for testing such cards is to insert the card into the system in which it is to be used, and then subject the system to all the functions it is to perform to determine whether it performs properly. This technique, however, merely provides a GO, NO-GO indication, and does not help in locating the faults. Another technique uses a diagnostic program prepared specially for the card, the program involving a succession of commands for applying a sequence of test stimuli to the card and reading out the card's responses. Inspection of the responses indicates whether there are any faults in the card. A disadvantage of this known technique, however, is the time and manpower required to rewrite or update the program with each new card to be tested or with each change in the card.

Furthermore, as integrated circuits become more sophisticated, the number of tests that must be performed on the card to locate all faults increases inordinately. For example, in one type of card carrying several tens of integrated circuits, about 100–200 tests were usually adequate to locate all possible faults in the card. Today, however, printed circuit cards are being used carrying several hundred integrated circuits each, and some of these cards require in the order of 15,000 or 20,000 tests to be performed on each card in order to locate all faults. Testing such cards by conventionaly techniques takes an unduly long period of time. Moreover, whenever the card is modified or a new card is put into use, the rewriting or updating of the testing program requires a very considerable investment of time and manpower.

BRIEF SUMMARY OF THE PRESENT INVENTION

A broad object of the present invention is to provide a new method and apparatus having advantages in the above respects for testing electrical circuit units. The invention is particularly useful, and is therefore described below, with respect to testing plug-in types of printed circuit cards having a large number of connector terminals or pins, e.g., in the order of 200.

According to one broad aspect of the test method and apparatus of the present invention, a reference or standard test pattern is first generated by applying a series of test stimuli sequentially to the terminals (e.g., pins) of a reference or standard electrical circuit unit (e.g., printed circuit card) known to be without faults. These reference responses are stored in a bulk memory with the test stimuli applied to generate them. The generated test pattern is then used in testing corresponding production cards, by applying the same test stimuli to the terminals of the production card and comparing their actual responses with the reference responses generated from the reference card and stored in the memory.

More particularly, a complete test procedure involves two modes of operation, namely a Generation Mode and an Automatic (GO, NO-GO) Test Mode, and a possible third mode, namely a Manual Test Mode.

In the Generation Mode, a printed circuit card known to be without faults (and therefore capable of serving as a reference or master card) is used for generating and storing a reference test pattern produced from a series of test stimuli applied sequentially to the terminals of the reference card. In this Generation Mode, each test stimulus is addressed to a selected terminal of the reference card; all the terminals of the reference card are scanned for their responses to the test stimulus; and the responses are read out and stored with the test stimuli in a bulk memory such as a disk file. The responses are derived by determining the terminal whose state changes as a result of the test stimulus, the identification of such terminal and the state thereof being stored in the memory. The foregoing steps are repeated by applying the test stimuli sequentially to all the terminals of the reference card and storing the responses produced thereby in the memory, thereby generating a complete test pattern comprising the test stimuli and the reference responses thereto.

In the Test Mode, which is used to test a production card, the stored test pattern generated from the reference card in the Generation Mode is utilized to test the production card for faults. This is done by addressing each test stimulus of the test pattern to a terminal of the production card, scanning all the terminals of the production card for their responses to the test stimulus and comparing same with the stored reference response produced from the reference card in the corresponding step in the Generation Mode. If the responses do not match, a fault is indicated. The foregoing steps are repeated in the Test Mode for all the terminals of the production card, the actual response produced by each test stimulus on all the terminals being compared with the stored reference ("should be") response produced from the reference card in the Generation Mode.

In the Automatic Test Mode, a GO, NO-GO test is made in which the test stimuli are serially applied to the terminals of the production card but are automatically interrupted whenever the actual response produced in any step does not match the stored reference response produced in the Generation Mode from the corresponding reference card. If the card under test is performing correctly, all the tests are completed, and a "PASS" indicator light is energized. However, if a fault is uncovered during the test by a mismatch between the stored reference response and the actual response produced from the production card, the tester automatically stops, and a "REJECT" indicator light is energized.

The operator may then trouble-shoot the card by operating the apparatus according to the Manual Test Mode, in which selected test stimuli may be individually applied to selected terminals to locate the fault.

The same apparatus may be used for testing a large number of different cards. For this purpose, a part number identifying the card is inputted into the apparatus during the Generation Mode and is stored with its respective reference test pattern. When a production card is tested in the Test Mode, the part number identification of the production card is read into the apparatus and is used for extracting from the bulk memory the stored reference test pattern of the corresponding reference card.

In the apparatus illustrated, the circuit unit being tested is a plug-in, digital printed circuit card bearing a plurality of integrated circuit chips and adapted to perform a large number of logic functions. The test stimuli are digital words specifying logic-oriented tests applied to the cards to perform all the logic functions involved in the respective cards.

According to another feature of the invention, the comparison of the stored reference responses produced from the reference card during the Generation Mode, with the actual responses produced from the production card during the Test Mode, is effected by an arrangement including a pair of flip-flops circuits provided in the apparatus for each terminal of the card being tested. One flip-flop (called the "pin" flip-flop) is connected to a circuit which reflects the actual condition of its respective terminal in response to the test stimulus applied during the Test Mode, and the other flip-flop (called the "comparison" flip-flop) is connected to a circuit which reflects the "should-be" or reference condition of the terminal as specified by the stored pattern produced from the reference card during the Generation Mode. The two flip-flop circuits are compared during each testing step in the Automatic Test Mode, and an error signal is produced if they do not match.

More particularly, the system includes an arrangement for setting one flip-flop ("pin"), of the pair for the input terminal receiving the test stimulus, in accordance with the binary state representative of the test stimulus, and for setting the other flip-flop ("comparison"), of the pair for the output terminal outputting the response to the test stimulus, in accordance with the binary state, representative of the reference response. The circuit connected to the "pin" flip-flop of the output terminal includes means sensing the actual response of the output terminal to the stimulus applied to the input terminal, and producing a binary signal representative of such actual response. The latter signal is then compared with the binary state of the "comparison" flip-flop of the output terminal representative of the reference response, and an indication is produced if they do not match.

According to another important feature of the invention, the apparatus is of a flexible, modular construction wherein the flip-flop pairs of all the terminals are divided into a plurality of groups, with a single matrix card being provided for all the flip-flops of one group. That is to say, where there are "n" terminals, there would be "c" matrix cards, each card carrying the flip-flop pairs for "n/c" terminals. In the apparatus illustrated, there are 200 ("n") terminals and eight ("c") matrix cards, so that each matrix card carries the flip-flop pairs for 25 terminals.

With the foregoing modular arrangement, each test stimulus and reference response is in the form of a multi-bit word, there being 16 bits in the example illustrated below. Different bits are decoded by the apparatus to select, respectively, a specific one of the eight matrix cards, a specific one of the 25 terminals, and a specific condition to be applied to the flip-flop pair of the selected terminal.

In the generated test pattern, the reference response word appears before the test stimulus word, and the test stimulus word includes the data bit commanding the comparison to be made.

The testing system of the present invention as briefly described above provides a number of important advantages, including the following: It enables a reference test pattern to be generated and stored in a memory device for each circuit unit so that when the corresponding production unit is to be tested, the pattern for the particular unit can be retrieved from the memory and used as a reference to determine the presence of faults in the production unit. It permits reference test patterns to be generated, stored, and updated in a short period of time and with a small investment of manpower. It enables the circuit units to be tested very quickly and in an automatic GO, NO-GO manner. It allows the use of logically oriented testing procedures to be used which aid the operator in trouble-shooting for errors. It provides the apparatus with substantial flexibility so that it can be easily modified for testing other circuit units having a larger or smaller number of terminals or requiring other tests to be performed. It enables the maintenance and repair of the apparatus to be substantially simplified particularly by the arrangement wherein all the flip-flop pairs for the circuit unit terminals are found in a plurality of identical matrix cards.

Further features and advantages of the invention will be apparent from the description below.

BRIEF DESCRIPTION OF THE DRAWINGS

To aid in better understanding the invention, it is herein described with respect to a system for testing a plug-in printed circuit card mounting a large number of integrated circuits and having 200 connector terminals or pins. In the drawings illustrating the described testing apparatus:

FIGS. 11, 11a and 11b illustrate the timing of the various clock pulses, sequence pulses, and signal levels involved in READ Operations;

FIGS. 12, 12a and 12b illustrate the timing of the various clock pulses, sequence pulses, and signal levels involved in WRITE Operations;

CONSTRUCTION OF THE ILLUSTRATED EMBODIMENT

General Arrangement

Figure 1:
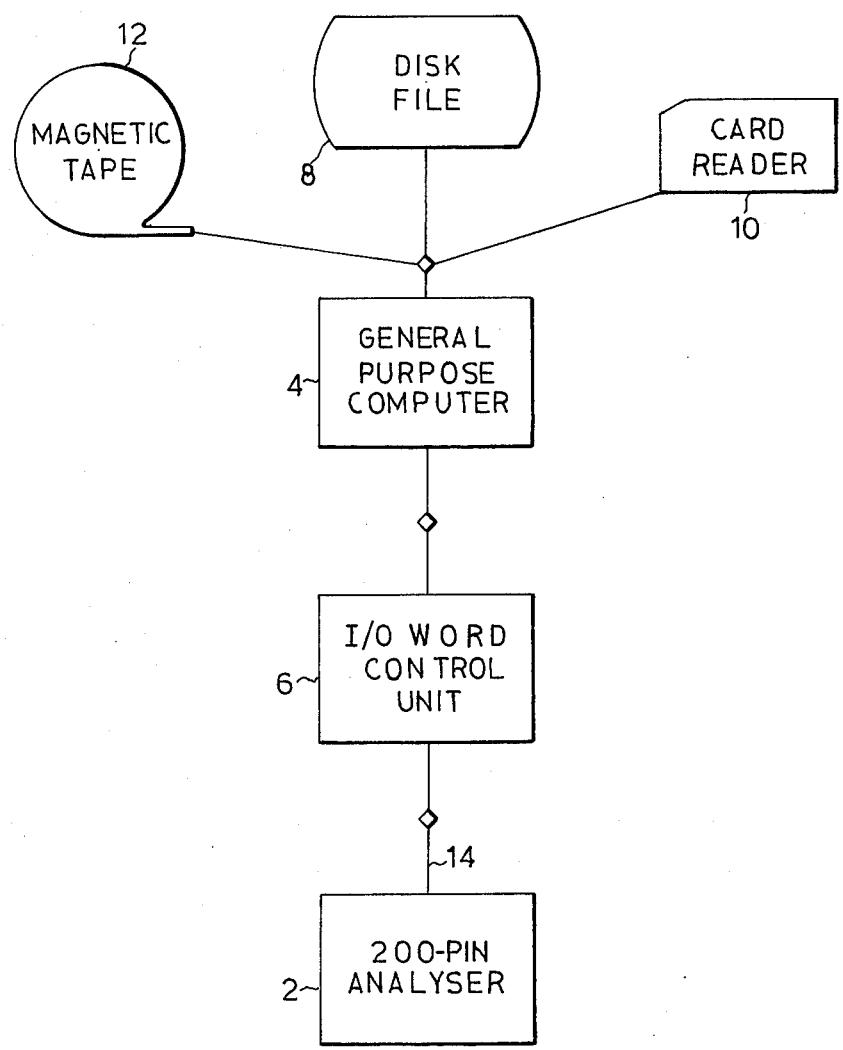
FIG. 1 is a block diagram showing the overall system.

The system illustrated in the drawings was designed for testing plug-in printed circuit cards each including about 120 integrated circuit chips or modules and having 200 connector pins or terminals. About 15,000 tests on the average are required for testing all the logic functions performed by each card. The system illutrated performs a complete Automatic Test Mode Operation providing a GO, NO-GO indication in but a few seconds. If a NO-GO is indicated, the system may be operated in accordance with a Manual Test Mode to troubleshoot the error.

The overall test system as illustrated in FIG. 1 includes a 200-pin analyser, generally designated 2, interfaced with a medium-scale, general-purpose computer 4 (such as a Burroughs 3700) via an Input-Output (I/O) Word Control Unit 6. The computer 4 is cable-connected to a bulk storage unit, such as a disk file 8, which is used to store the library of generated reference test patterns for all the given types of cards to be tested by the system. A card reader 10, also cable-connected to the computer 4, is used for inputting the program of tests to be used. The system further includes a magnetic tape unit 12 which is used in loading and dumping the disk file storage unit 8 with respect to the memory of the computer 4.

In the example to be described below, the tests are each in the form of a 16-bit word, and the I/O Word Control Unit 6 operates at a computer input/output transfer cycle of 250,000 words or tests per second. The data transfer speed from the disk file 8 to the memory of the computer 4 is slow compared to the high speed transfer of the I/O Word Control Unit 6 to the tester, and therefore the I/O Word Control Unit can handle up to 15 testers in a time-shared manner. Each tester can accommodate up to three 200-pin analyser units 2 and can perform the complete testing operation with a few seconds at this optimized speed.

Figure 2:
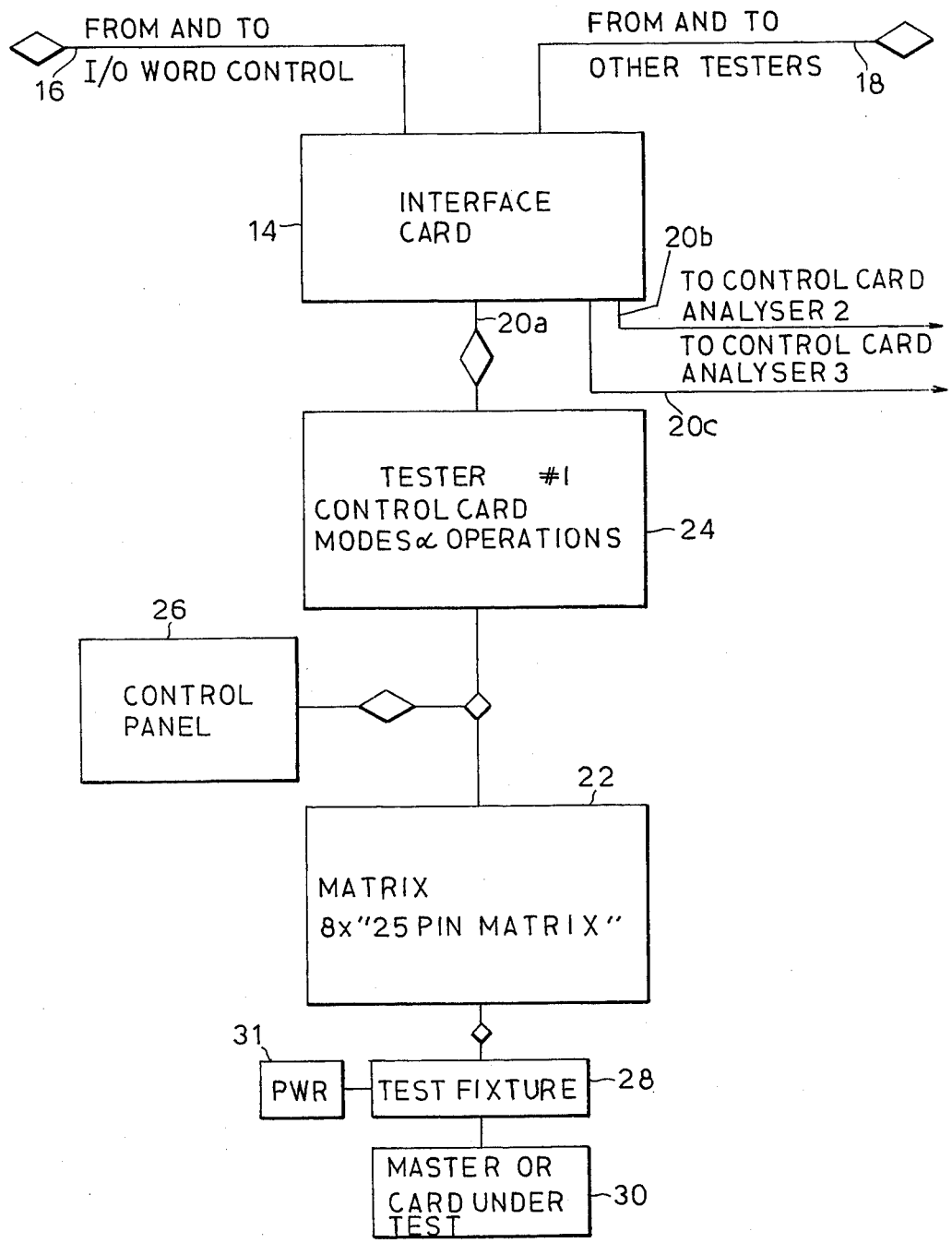
FIG. 2 is a block diagram of the 200-pin analyser in the system of FIG. 1.

FIG. 2 is a block diagram of one of the 200-pin analyser units 2, including an interface circuit 14 communicating with the I/O Word Control Unit 6 via cable 16. The interface circuit 14 is connected via line 18 to the other testers (up to 15 as mentioned above) which time-share computer 4. A common interface 14 is used for all three analysers included in the one tester, the three analysers being connected to the interface circuit by lines 20a, 20b, and 20c respectively.

The tester unit, including its three analysers, is constructed according to a modular technique in which the bulk of the circuitry is contained on a number of identical printed circuit cards. Altoghether there are 28 printed circuit cards in a three-analyser tester unit. Of these, 24 cards are identical and include the circuitry which controls the logic status of each of the 200 pins in each of the three analysers. These are illustrated in FIG. 2 as the matrix cards 22, thee being eight such cards for each of the three analysers in a tester unit. The interface circuitry for all three analysers is included in a single card, this being shown by the single block 14 in FIG. 2. In addition, there are three control cards 24, one for each of the three analysers in a tester, thereby bringing the total number of cards in the three-analyser tester to 28.

The circuitry of the three-analyser tester as contained on the 28 cards will be described below. At this point, it will be helpful merely to point out that each one of the eight matrix cards 22 accommodates the pair of flip-flops (called "pin" and "comparison") which are connected to circuits reflecting the actual and reference conditions of the card pins being tested when a production card is tested in the Test Mode, which conditions are compared to determine whether a fault is present. Each one of the three control cards 24 accommodates the control circuitry of each analyser including the input register, decoding units, and various flip-flops in such control circuitry; and the single interface card 14 accommodates the circuitry between the control card for each analyser and the I/O Word Control Unit 6.

The analyser block diagram of FIG. 2 also schematically illustrates the control panel 26 containing the switches and displays used by the operator to perform the various modes of operation. Control panel 26 is more particularly illustrated in FIG. 5 and is described below.

Also schematically shown in the block diagram of FIG. 2 is the test fixture 28 which receives the reference printed circuit card during the Generation Mode, and the production circuit card to be tested during the Test Mode. Both cards are schematically illustrated in block 30 in FIG. 2. The test fixture 28 connects the respective card with the analyser circuitry including the matrix cards 22, and also provides the electrical power to the card being tested as diagrammatically shown by the Power block 31.

Figure 3A:
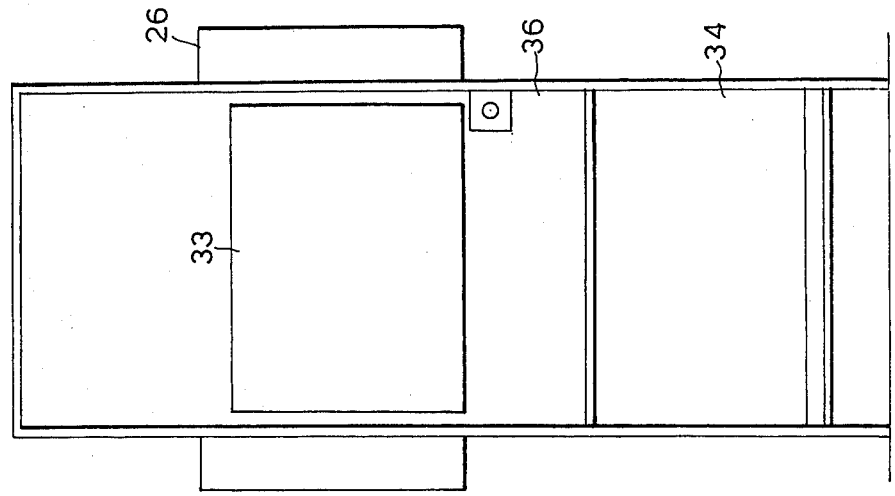
FIG. 3a is a side elevational view, of the external configuration of the 200-pin analyser of FIG. 2.
Figure 3:
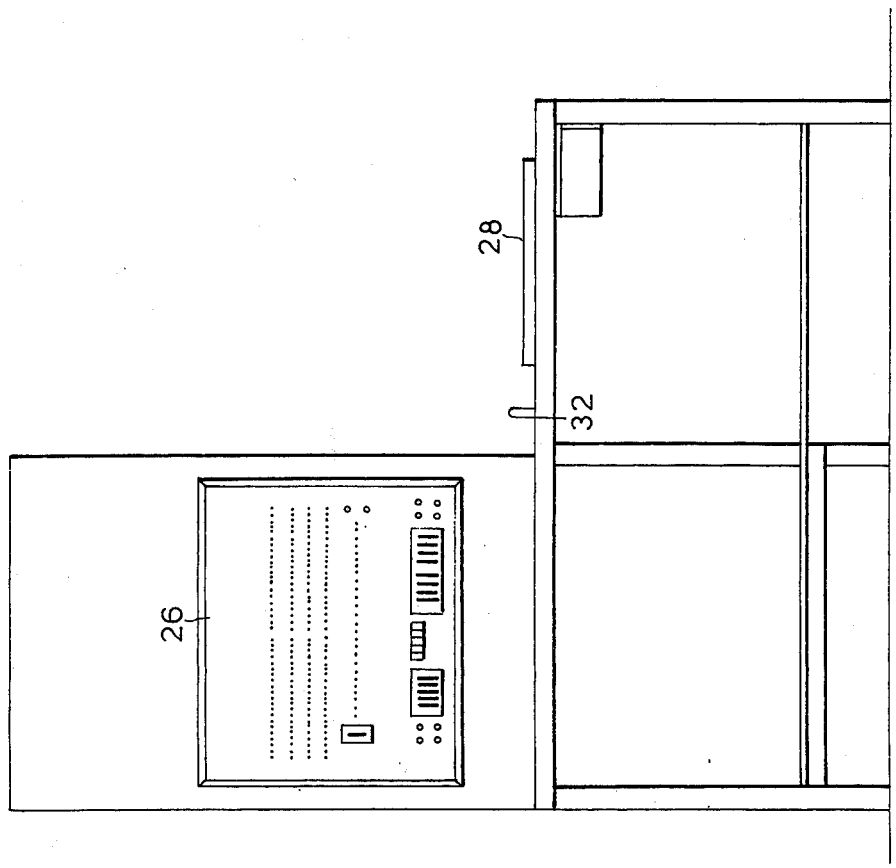
FIG. 3 is a front elevational view.

The cabinet of a single analyser unit is illustrated from the front in FIG. 3 and from the side in FIG. 3a. Shown in FIG. 3 are its control panel 26 (illustrated in detail in FIG. 5), its test fixture 28 (illustrated in detail in FIG. 4) supported on a table 32, an upper compartment 33 for the 28 printed circuit cards (14, 22, and 24 described earlier), a lower compartment 34 for the power supply (31, FIG. 2), and a middle compartment 36 for a fan assembly (not shown) to cool the cards and power supply.

Test Fixture and Card to be Tested

Figure 4:
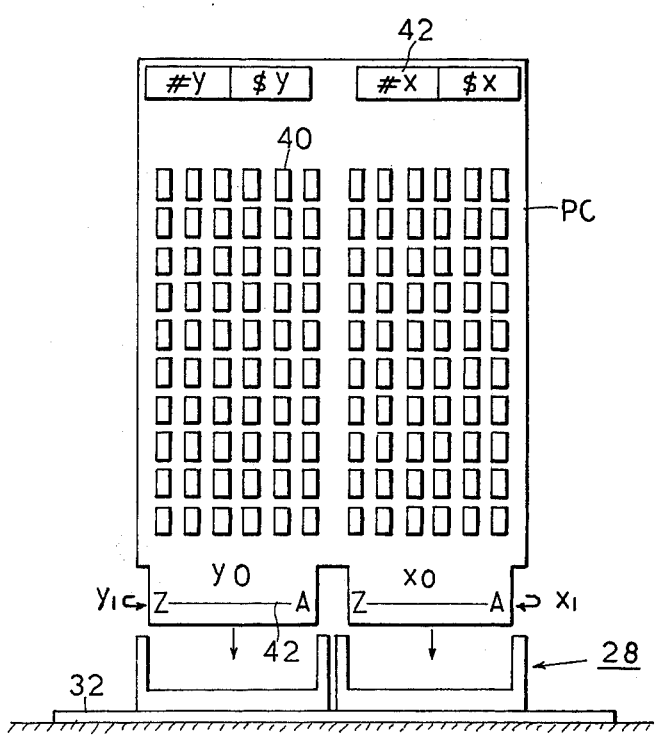
FIG. 4 is a front elevational view.
Figure 4A:
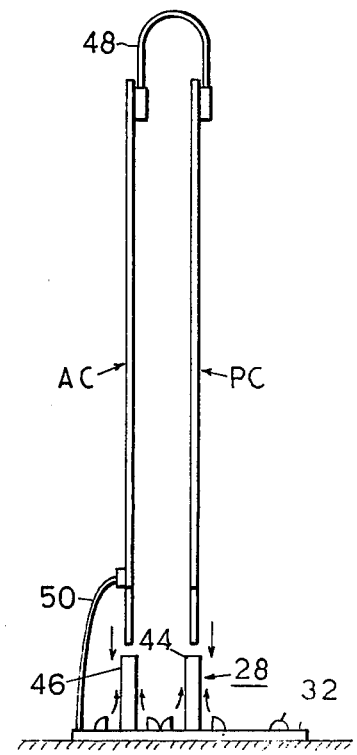
FIG. 4a is a side elevational view.
Figure 4B:
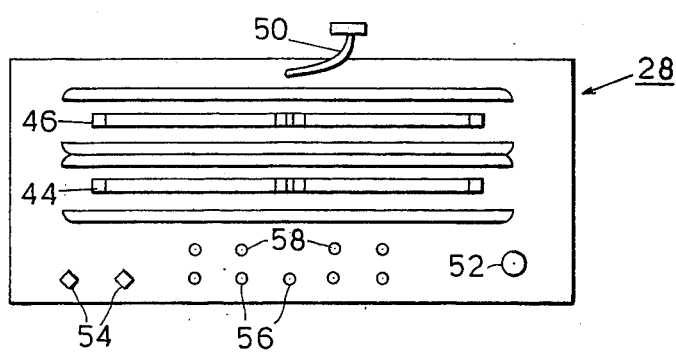
FIG. 4b is a top plan view, of the test fixture.

FIGS. 4, 4a and 4b illustrate the test fixture 28 which receives the card being tested and makes the appropriate connections between it and the analyser circuitry. FIG. 4 also illustrates the general construction of the printed circuit card to be tested, the construction being the same for both the reference or master card and the production card.

The printed circuit card to be tested is designated PC (FIGS. 4 and 4a) and is of a standard type used in commercial computers. The component side of the card is the side illustrated in FIG. 4 and it will be seen that that side mounts a plurality (120 in this case) integrated circuit chips or modules 40. The opposite side of the card (opposite to that shown in FIG. 4) is the solder side and contains the conductive pathways and solder connections from the integrated circuits to the plug-in connector terminals, generally designated 42. The connector terminals, frequently called pins, are located at the opposite ends of the card. Some are at the top end of the card in the view of FIG. 4, these being frequently called the front-plane pins, and the remainder are at the bottom end of the card in the view of FIG. 4a, these being frequently called the back-plane pins.

The 200 pins of the card PC illustrated in FIG. 4 are divided into eight groups, each group including 25 pins. The eight groups are identified as follows:

TABLE 1

| 1. | Group $X_0$ | 5. | Group $\#Y$ |
|---|---|---|---|
| 2. | $Y_0$ | 6. | $\$Y$ |
| 3. | $X_1$ | 7. | $\#X$ |
| 4. | $Y_1$ | 8. | $\$X$ |

Each of the eight groups includes 25 pins, these being identifed by the alphabetical letters A–Z, with the letter "O" being omitted. For example, the first pin of Group $X_O$ would be identified as pin $X_OA$, and the fifth pin of Group $Y_O$ would be identified as $Y_OE$. Nomenclature is thus provided for identifying all 200 of the connector pins of the card.

As shown in FIG. 4, the 25 pins of group $Y_O$ occupy one-half of the back-plane (bottom end, as viewed in FIG. 4) on the component side of the printed circuit card, and the 25 pins of group $X_O$ occupy the other one-half of the back-plane on the component side of the card. The 25 pins of the $Y_1$ group are disposed on the $Y_O$ half the back-plane of the card but on the opposite (solder) side with respect to that shown in FIG. 4. Similarly, the 25 pins of the $X_1$ group occupy the $X_O$ back-plane half of the card on the solder side.

The remaining four groups of pins each occupies one-fourth of the front-plane (top end, as viewed in FIG. 4) of the printed circuit card, each group extending on both the component side and the solder side of the card.

The test fixture 28 includes a connector 44 (FIG. 4b) for receiving the pins of the four back-plane groups $X_O$, $Y_O$, $X_1$ and $Y_1$. For making connections to the front-plane pin groups, the test fixture is provided with a second connector 46 receiving an adapter printed circuit card AC (FIG. 4a), the connections being made by flat cables 48 from the adapter card AC to the front-plane pins of the printed circuit card PC under test. Flat cables 50 are also used for making the electrical connections from the connectors 44, 46, to the analyser circuitry.

As shown particularly in FIG. 4b, the desk 32 supporting the test fixture 28 may include various control switches and displays. FIG. 4b illustrates for purposes of example, a power switch 52, two test switches 54 (e.g. +12V), five test voltage sources 56 (e.g., 4.75V, −2V, +12V, −12V, and "ground") and four LED indicators 58, one for each of the test voltage sources except "ground."

Figure 5:
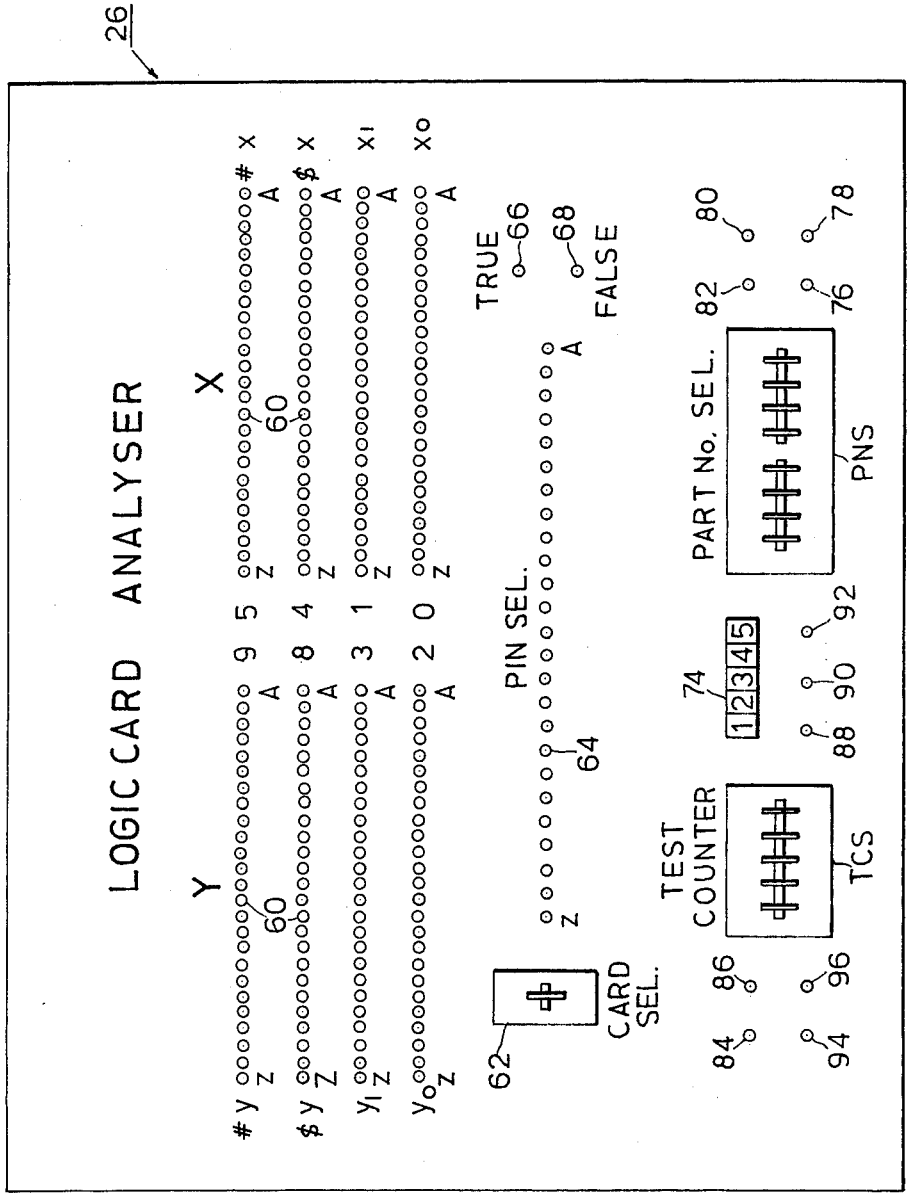
FIG. 5 illustrates the control panel in the apparatus of FIGS. 3 and 4.

Control Panel 26 (FIG. 5)

The analyser control panel 26 is shown in detail in FIG. 5. A substantial portion of its face is occupied by 200 light indicators 60, there being one indicator for each of the 200 pins of the printed circuit card PC to be tested. The indicators 60 are light emitting diodes (LED's) each allocated to and able to display the logic status of one of the card pins, and are labelled with the same identification as the pins, as described above.

The control panel 26 further includes a Matrix Card Selector in the form of a decade switch 62 which may be manually moved to eight different positions (0–9, Positions 6 and 7 not being used as described below) for selecting any one of the eight matrix cards 22 (FIG. 2) included in the tester. A group of 25 Pin Selector Switches 64 is provided for selecting the specific pin, these switches being labelled A–Z (omitting "O") in accordance with the identification of the pins. Thus, switches 62 and 64 enable the selection of any one of the 25 pins on any one of the eight matrix cards, i.e., any one of the 200 pins of the card being tested.

A push-button switch 66 on control panel 26 enables the selected pin to be preset "true" ("1"), and a second push-button switch 68 enables the selected pin to be preset "false" ("0"). Switches 66 and 68, together with the Matrix Card Selector 62 and the Pin Selector 64, are used particularly in the Manual Test (Trouble-shooting-)Mode of operation, as will be described below.

The control panel further includes a Part Number Selector PNS constituted of eight dial switches each presettable from "0" to "9." In the embodiment of the invention described below, only the six middle digits are used, thereby enabling Part Number Selector PNS to specify any six digit part number.

A Test Counter Presetter in the form of a five digit dial switch TCS is provided to enable presetting a Test Counter (to be described below) included in the tester to any specific test. A five digit Test Counter Display 74 shows the status of the Test Counter.

Further included in control panel 26 are a number of push-buttons which, when depressed, perform the following functions: CLEAR push-button 76, allows the control to reset all the matrix flip-flops; START push-button 78, initiates the automatic test of the card; DISPLAY ERROR push-button 80, displays the pins in error; and SINGLE-PULSE push-button 82, allows a single pulse circuit in the I/O Word Control Unit 6 to send a single clock pulse to the test fixture.

Among the other indicators included on the control panel 26 are: a PASS indicator 84, which is energized when the test successively reaches the end ("GO"); a REJECT indicator 86, which is energized when any error is encountered during the test (NO-GO); a READY indicator 88, which is energized when the analyser is under computer control; a PART NUMBER indicator 90, which is energized when the computer is reading the part number; and a TEST indicator 92, which is energized when the apparatus is transmitting data to or from the analyser during the Test Mode of operation. The foregoing indicators are all preferably light-emitting diodes (LED's).

Lastly, the control panel includes a MAINTENANCE push-button 94 which disconnects the tester from the I/O Word Control Unit 6 for maintenance purposes, and an MAINTENANCE CLEAR push-button 96 which reconnects the tester to the I/O Word Control Unit 6.

General Test Procedure

As indicated briefly above and as to be described more fully below, a complete test procedure involves first generating a reference test pattern from a reference card in a Generation Mode of operation by applying a series of test stimuli to the reference card, and subsequently comparing the reference test pattern with the actual responses produced from a production card being tested during the Test Mode when the same test stimuli are applied to the production card. In both Modes, each test stimulus is addressed to a selected pin of the card (reference card or production card), and then all the pins of the card are scanned for their responses to the test stimulus. Whenever a pin changes its condition as a result of the test stimulus, this is noted and recorded as the response to the test stimulus. A pair of flip-flops are provided for each pin of the card being tested. One flip-flop (called the "pin" flip-flop) is connected to a circuit which reflects the actual response of its respective pin to the test stimulus during the Test Mode, and the other flip-flop (called the "comparison" flip-flop) is connected to a circuit which reflects the reference or "should be" response. The conditions of the two flip-flop circuits are compared during each step in the Test Mode, and an error signal is produced if they do not match.

To illustrate the general test procedure, the description below will set forth the complete procedure and and the circuitry involved for testing an AND-gate 100 (FIG. 8) whose input pin is designated $Y_OA$ of the test fixture and whose output pin is designated $Y_OB$.

Briefly, this AND-gate (100, FIG. 8) is tested as follows: If a logical "1" is applied to its input (pin $Y_OA$), its output (pin $Y_OB$) should become "1"; then if its input is forced to go back to "0," its output should follow and become "0."

In the Generation Mode, the procedure for testing this AND-gate would be as follows:

(1) WRITE a first test stimulus to force a "1" (true) at the input of the AND-gate (pin $Y_OA$).

(2) READ the complete matrix, and find that pins $Y_OA$ and $Y_OB$ are both "1." These are the only pins which are "1" since all the pins were "0" at the start (before Step 1). The test program knows that the input pin $Y_OA$ was "1" before this Step 2 (it having been changed to "1" in Step 1), and therefore pin $Y_OB$ is the only one whose status has changed. Accordingly, there is recorded in the memory that the response to the test stimulus in Step 1 is that pin $Y_OB$ is "1".

(3) WRITE the next test stimulus to force a "0" (false) at the input pin $Y_OA$ of the AND-gate.

(4) READ the whole matrix and find that pins $Y_OA$ and $Y_OB$ are "0." Since the program knows that the input pin $Y_OA$ was "0" (in Step 3), the response to the test stimulus of Step 4 is recorded as $Y_OB$ is "0."

The foregoing testing procedure is set forth more fully below particularly with reference to Tables 7, 8 and 9.

The test program includes a series of such test stimuli which are applied sequentially to all the pins of the reference card, each test stimulus being addressed to a selected pin of a reference card, and all the pins of the reference card being scanned for their responses. The new status of each pin is compared with the old status, and whenever a change is noted, this is recorded as the response to the applied test stimulus. The series of test stimuli, and the responses produced as a result of applying the test stimuli to all the pins of the reference card, constitute the reference test pattern generated and stored in the Generation Mode.

In the Test Mode, the test pattern generated in the Generation Mode is extracted from the memory and is used for testing the production cards. The test pattern applies the same test stimuli to the production card while the reference responses in the test pattern are compared to the actual responses produced by the production card. More particularly, each test stimulus is applied to an input pin of the production card, as specified by the stimulus itself, the actual response produced on an output pin as a result of the test stimulus is applied to the circuit connected to the "pin" flip-flop of the pair allocated to that output card pin; and the reference or "should-be" response, as determined in the Generation Mode, is applied to the "comparison" flip-flop of the pair allocated to that output pin. Thus, the condition of the circuit connected to the "pin" flip-flop reflects the actual status of the output pin, and the condition of the "comparison" flip-flop reflects its reference or "should be" status. The two are compared in a pin status comparator; if they match, this indicates no fault, whereas if they do not match, a fault is indicated.

When making an automatic GO, NO-G0 test in the Test Mode, the "result" or response must be declared before the "cause" or test stimulus. This is because the "cause" or test stimulus (which is in the form of a 16-bit word as to be more fully described below) commands the comparison and includes the test bit (bit D1) which actually effects the comparison. Accordingly, the "result" or response word of Step 2 above will precede the "cause" or test stimulus word of Step 1 above, and similarly the "result" or response word of Step 4 above will precede the "cause" or test stimulus word of Step 3 above. This will be described more fully below.

Test Word Format

As indicated earlier, the test stimuli, applied both to the reference printed circuit card during the Generation Mode and to the production card during the Test Mode, are in the form of digital words. In the example illustrated, the test words are of 16-bits each, divided into four groups A–D of 4-bits per group. The four "A" bits are decimally decoded in the apparatus to specify the specific one of the eight matrix cards; the eight "B" and "C" bits are decimally decoded to specify the specific one of the 25 pins; and the four "D" bits are decoded to specify the specific test stimulus or command to be applied to the flip-flop pair of the selected pin.

More particularly, the four "A" bits in the example illustrated are decimally decoded to specify the specific matrix card 22 (FIG. 2) of the test fixture 28 allocated to the specific pin of the card being tested, as follows:

TABLE 2

| 0 | selects matrix card allocated to pin group | $X_0$ |
| 1 | | $X_1$ |
| 2 | | $Y_0$ |
| 3 | | $Y_1$ |
| 4 | | $X |
| 5 | | # X |
| 8 | | $Y |
| 9 | | # Y |

The four "B" and "C" bits of the test word are decimally decoded by the apparatus to select one of the 25 alphabetically-identified pins of the selected card, according to the following alphabetical code:

TABLE 3

| Pin | | A | B | C | D | E | F | G | H | I | J | K | L | M | N | P | Q | R | S | T | U | V | W | X | Y | Z |
|---|---|---|---|---|---|---|---|---|---|---|---|---|---|---|---|---|---|---|---|---|---|---|---|---|---|---|
| B Bits | 8 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 |
| | 4 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 |
| | 2 | 0 | 0 | 0 | 0 | 0 | 0 | 0 | 0 | 0 | 0 | 0 | 0 | 0 | 0 | 0 | 0 | 1 | 1 | 1 | 1 | 1 | 1 | 1 | 1 | 1 |
| | 1 | 0 | 0 | 0 | 0 | 0 | 0 | 0 | 0 | 1 | 1 | 1 | 1 | 1 | 1 | 1 | 1 | 0 | 0 | 0 | 0 | 0 | 0 | 0 | 0 | 0 |
| C Bits | 8 | 0 | 0 | 0 | 0 | 0 | 1 | 1 | 0 | 0 | 0 | 0 | 0 | 1 | 1 | 0 | 0 | 0 | 0 | 0 | 0 | 1 | 1 |
| | 4 | 0 | 0 | 1 | 1 | 1 | 1 | 0 | 0 | 0 | 0 | 1 | 1 | 1 | 0 | 0 | 0 | 1 | 1 | 1 | 1 | 0 | 0 |
| | 2 | 0 | 1 | 1 | 0 | 0 | 1 | 1 | 0 | 0 | 0 | 1 | 1 | 0 | 0 | 1 | 0 | 0 | 1 | 1 | 0 | 0 | 1 | 1 | 0 | 0 |

TABLE 3-continued

| Pin | A | B | C | D | E | F | G | H | I | J | K | L | M | N | P | Q | R | S | T | U | V | W | X | Y | Z |
|---|---|---|---|---|---|---|---|---|---|---|---|---|---|---|---|---|---|---|---|---|---|---|---|---|---|
| | 1 | 1 | 0 | 1 | 0 | 1 | 0 | 1 | 0 | 1 | 1 | 0 | 1 | 0 | 1 | 1 | 0 | 1 | 0 | 1 | 0 | 1 | 0 | 1 | 0 | 1 |

The four "D" bits of the test word are decoded by the apparatus to specify the actual test stimuli or command to be applied to the selected pin of the selected card, more particularly to the flip-flop pair of the selected pin, according to the following code:

TABLE A

| D Bits 8 4 2 1 | Code | Signification | Pin F.F. | Comp. F.F. | Test F.F. Set |
|---|---|---|---|---|---|
| 0 0 0 0 | 0 | Reset an input pin | 0 | 0 | 0 |
| 0 0 0 1 | 1 | Reset an input pin and test | 0 | 0 | 1 |
| 0 0 1 0 | 2 | Set an input pin | 1 | 1 | 0 |
| 0 1 1 1 | 7 | Set an input pin and test | 1 | 1 | 1 |
| 1 0 0 0 | 8 | Reset an output pin | 0 | 0 | 0 |
| 1 0 1 0 | 0 | Set an output pin | 0 | 1 | 0 |

It is to be noted that the D1 bit is the "test" bit, and acts to "set" a Test Flip-Flop (TFF, FIG. 7) included in the analyser as described below. This D1 is significant during the Test Mode when the actual responses of a production card are being compared with the reference responses of the reference card as generated during the Generation Mode. This bit specifies that a comparison is to be made between the status of the circuit connected to the "pin" flip-flop (reflecting the actual status of the selected pin in the card being tested) and the status of the circuit connected to the "comparison" flip-flop (reflecting the reference or "should be" status of the pin).

The D8 bit is the output flag of a word and specifies whether the output pin should be set or reset.

Some other special WORDS have a special "A" bits configuration (0 : A8-2 set) and have a particular signification. They are:

TABLE 5

| 0003 : "CLEAR" all the matrix flip-flops |
| 0004 : activates the single clock pulse circuitry |
| 0006 : "End-of-Test" Word |

As mentioned earlier, the "result" word specifying the response in the reference test pattern precedes the "cause" word specifying the test stimulus, since the stimulus, since the "cause" word includes the test bit (D1) which commands the comparison.

Following the above-described test word format, the four words recorded in the memory for the four steps described above for testing AND-gate 100 are as follows:

TABLE 6

| | Word 1 (response) | Word 2 (test) | Word 3 (response) | Word 4 (test) | Word 7 (special) |
|---|---|---|---|---|---|
| 4A BITS | 2 Card Y₀ | 2 Card Y₀ | 2 Card Y₀ | 2 Card Y₀ | 0 |
| 4B BITS | Z pin "B" | Z pin "A" | Z pin "B" | Z pin "A" | 0 END-OF-TEST |
| 4C BITS | 2 | 1 | 2 | 1 | 0 |
| 4D BITS | 0 OUTPUT TRUE | 7 INPUT TRUE | 8 OUTPUT FALSE | 1 INPUT FALSE | 6 |

Thus, Word 1 will be decoded to specify the response that pin $Y_0B$ is "true" ("1") when the test stimulus (Word 2) is applied to make pin $Y_0A$ "true" ("1"), Word 2 also including the data bit D1 (decimal "7" decoded) commanding the comparison test to be made.

Similarly, Word 3 will be decoded to specify the response that pin $Y_0B$ is "false" ("0") when the test stimulus (Word 4) is applied to make pin $Y_0A$ "false" ("0"), Word 4 also including the test bit D1 (decimal "1" decoded) which commands that the test be made.

Word 7 is a special End-of-Test word which initiates an End-of-Test sequence as will be described more fully below.

General Layout of Analyser

Figure 7:
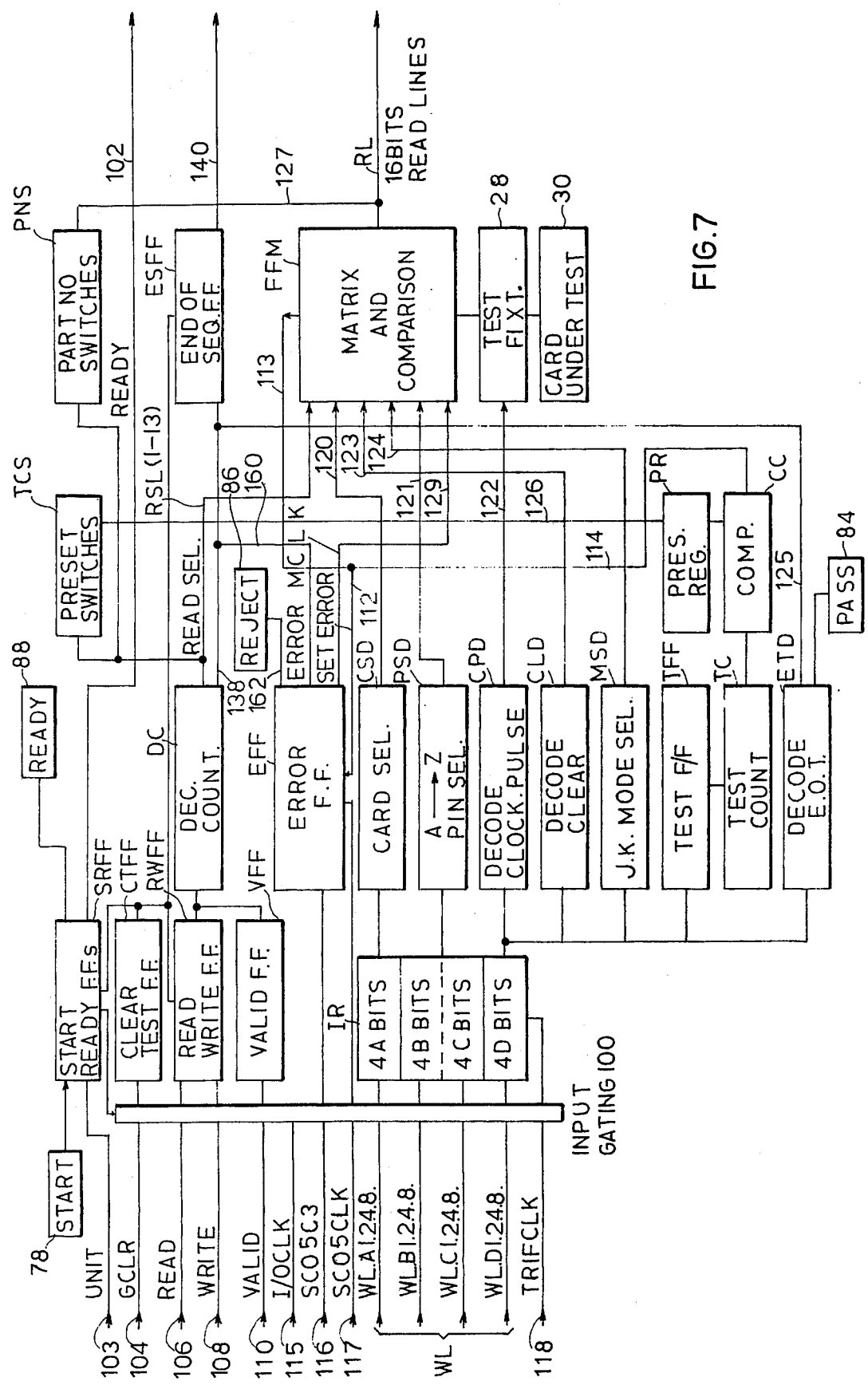
FIG. 7 is a block diagram of the analyser in the described test apparatus.

The general layout of the analyser unit is illustrated in FIG. 7. As mentioned earlier, each tester includes up to three analyser units, and the I/O Word Control Unit 6, which interfaces the tester with the computer 4 (FIG. 1), handles up to 15 testers in a time-shared manner.

The various data, control and clock signals applied to the analyser unit are schematically shown at the left side of FIG. 7. The input gating of these signals from the computer 4 to the analyser is schematically indicated by block 100, this being controlled by the I/O Word Control Unit 6 which interfaces the two. The output signals from the analyser are indicated at the right side of FIG. 7, these signals also being supplied to the I/O Word Control Unit 6 for transmission to the computer. The timings of the data, control and clock signals to, from, and within the analyser are illustrated in FIGS. 11 and 12, and will be described below with respect to specific operations.

As shown in the block diagram of FIG. 7, the START push-button 78 (in the control panel of FIG. 5) controls Start and Ready Flip-Flops SRFF which are set when the push-button is depressed. This provides a Ready signal on output line 102 to the I/O Word Control Unit 6, and also energizes the READY indicator 88 on the control panel (FIG. 5). The analyser unit is thus placed in a READY condition to operate when it receives its respective unit designation on incoming line 103, the system time-sharing up to 15 units with the computer as mentioned earlier.

The analyser unit further includes a Clear Tester Flip-Flop CTFF which is set by a GENERAL CLEAR signal on line 104. Further included is a Read-/Write Flip-Flop RWFF which is reset to Read a READ level signal on line 106, and is set to Write by a WRITE level signal on line 108.

Further included in the analyser is a Validity Flip-Flop VFF which is set by a VALID level signal on line 110. Flip-flop VFF controls a Decimal Counter DC such that when flip-flop VFF is set (in the Generation Mode) it enables the Decimal Counter DC to be incremented, whereas when it is reset (GO, NO-GO Test Mode), the Decimal Counter is not incremented.

The analyser further includes an Error Flip-Flop EFF which, upon the occurrence of an error, is set by an ERROR signal fed from line 112. The ERROR signal on line 112 may be derived via line 113 from sensing an actual error in Flip-Flop Matrix FFM containing the above-mentioned flip-flop pairs for each card pin, or may be derived via line 114 from sensing the end of the test by a Preset Register PR, both more fully described below. When Error Flip-Flop EFF is set, it terminates the test, and also energizes the REJECT indicator 86 on the control panel 26 (FIG. 5).

FIG. 7 further illustrates various gating signals derived from the I/O Word Control Unit 6 for controlling various operations. Thus, the basic clock of the I/O Word Control Unit 6 (e.g. 1.5MHz) is applied via line 115 of FIG. 7; an Sc=05C3 sequence is applied via line 116; an SC=05CLK clock is applied via line 117; and a TRIFCLK clock is applied via line 118. The timings of these signals are illustrated in FIGS. 11 and 12, and will be described below with respect to specific operations of the system.

The above-mentioned flip-flop pairs provided for each pin of the card being tested, together with the associated circuitry of the flip-flop pairs, are contained on the previously mentioned eight matrix cards 22 (FIG. 2), there being one card for each group of 25 pins. The complete Flip-Flop Matrix of all eight cards is illustrated in FIG. 7 by the single block FFM, FIG. 7 also illustrating the test fixture at 28 and the card under test at 30.

Figure 8:
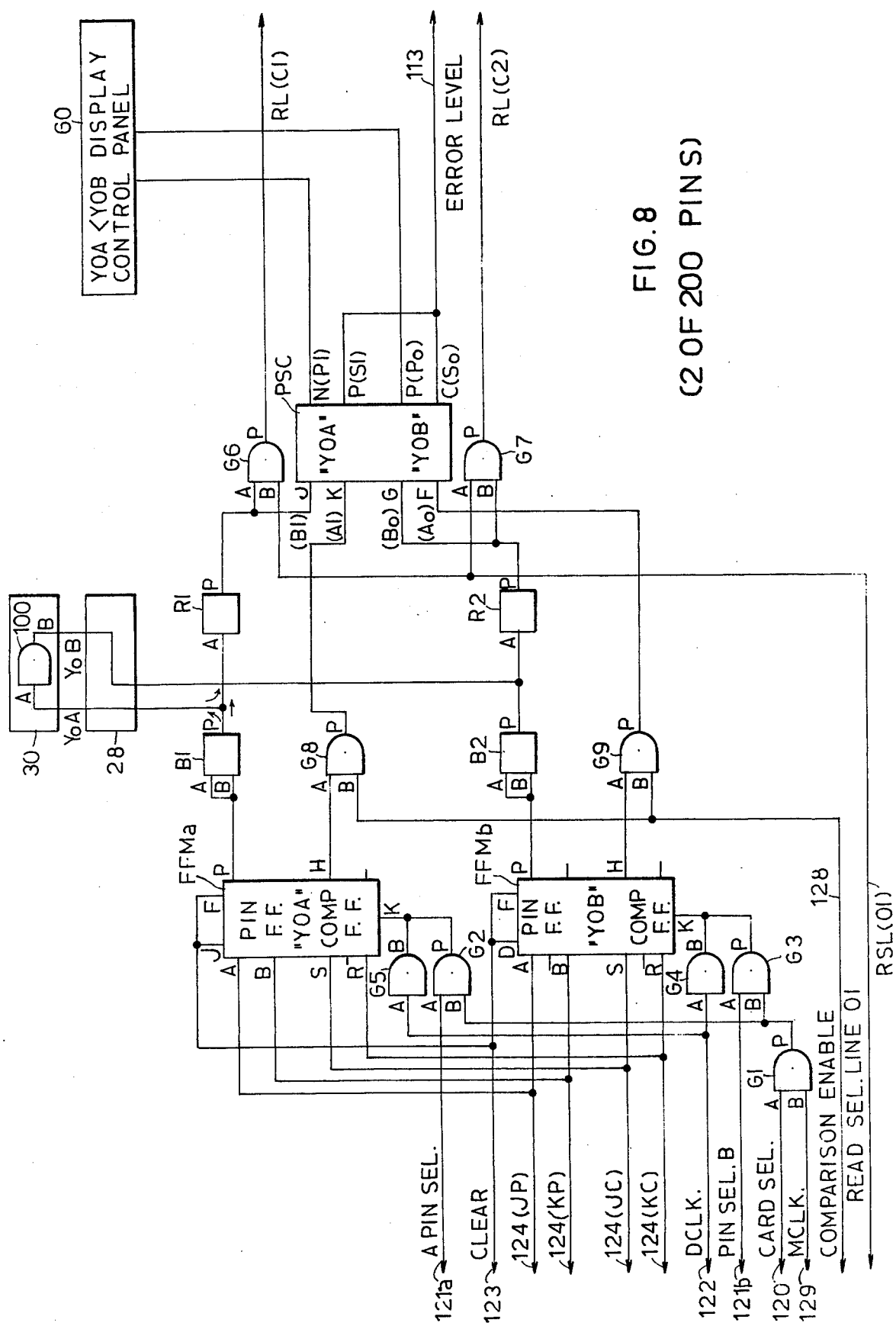
FIG. 8 is a block diagram illustrating the main components involved in the testing of two of the 200 terminals or pins of the printed circuit card being tested.

As described earlier, the circuit connected to the "pin" flip-flop of each pair reflects the actual condition of the respective pin in response to the test stimulus, and the circuit connected to the "comparison" flip-flop of the pair reflects the reference or "should be" condition as generated by the reference card and stored in the memory. FIG. 8 illustrates the flip-flop pairs and the associated circuitry for the two pins $Y_OA$, $Y_OB$, pin $Y_OA$ being the input pin for AND-gate 100 tested in the example described, and pin $Y_OB$ being the output pin. Flip-flop pair for pin $Y_OA$ is designated FFMa and that for pin $Y_OB$ is designated FFMb. In this case, both pairs are found on the same matrix card of the eight provided to accommodate the flip-flop pairs and associated circuitry for all 200 pins of the card being tested.

The matrix cards FFM receive the information from the test word via the input Write Lines WL, (left side of FIG. 7) after the test word has been decoded to specify the card, pin, and operation involved in the test. Since the test word includes 16-bits, divided into four groups A-D, there are 16 Write Lines WL divided into four groups WL(A)-WL(D), each group including four lines.

The flip-flop circuits of the matrix cards FFM are scanned by an incrementing signal supplied from Decimal Counter DC via 13 Read Select Lines RSL and the status of the flip-flop circuits is read out via 16 Read Lines RL, to the I/O Word Control Unit 6. The foregoing are better shown in FIG. 6 and will be described more particularly below. If during a testing operation an error is found, an ERROR signal is fed from output line 113 of matrix FFM (FIGS. 7, 8) to line 112 of the Error Flip-Flop EFF to set it. This terminates the test and also energizes the REJECT indicator 86 on the control panel 6, as noted above.

The 16-bit test words are inputted into an Input Register IR via the 16 Write Lines WL(A) -WL(D) and are clocked by the clock pulse (TRIFCLK) applied via line 118 from the I/O Word Control Unit 6.

The four "A" bits of the test word specify the specific matrix card (per Table 2) and are fed to Card Selection Decoder CSD where they are decimally decoded, the decimally decoded signal being fed via line 120 to select the appropriate flip-flop groups card. The four "B" bits and the four "C" bits of the test word specify the specific one of the 25 pins of the matrix card (per Table 2), these bits being decoded in Pin Selection Decoder PSD and their decimal equivalent being fed via line 121 to the flip-flop pair (e.g. FFMa, FFMb, FIG. 8) of the specified pin.

The four "D" bits which specify the actual test stimulus (per Table 4) are fed to a number of decoders: The clock Pulse Decoder CPD produces clock pulses which are applied via line 122 to the text fixture 28 containing the card (30) under test; the Clear Decoder CLD produces a signal which is applied via line 123 to reset all the flip-flops of the matrix FFW; and the Mode Select Decoder MSD produces a signal which is applied via line 124 to specify the condition to be applied to the selected flip-flop pair of the matrix FFW.

Further, the "D" bits, particularly the D1 bit which commands the test operation as mentioned above (and as shown in Table 4) is also fed to a Test Flip-Flop TTF. The latter flip-flop is normally in its reset condition but is set by the presence of the D1 bit When set, among other functions it causes a Test Counter TC to be incremented. The count in Test Counter TC is continuously compared by a Comparison Circuit CC with the count in the Preset Register PR, and when the counts are equal, a signal is outputted via line 114 to line 112, which sets the Error Flip-Flop EFF, as described above. The construction and operation of Test Counter TC, Preset Register PR, and the Comparison Circuit CC, are described more fully below with respect to FIG. 10.

Lastly, the "D" bits from the Input Register IR are also fed to the End-of-Test Decoder ETD so that when the End-of-Test Word (Word 7 in the example described above) is received, a signal is fed from decoder ETD via line 125 to End-of-Sequence Flip-Flop ESFF, as will be described more fully below. The End-of-Test Decoder ETD also energizes the PASS Indicator 84 on the control panel, to indicate that the test has been successfully completed.

The block diagram of FIG. 7 also includes the Test Counter Switch TCS which controls Preset Register PR via line 126 to select the number of tests to be performed. FIG. 7 also illustrates the Part Number Switches PNS which enable inputting the part number identification of the card being tested. As mentioned above, during the Generation Mode, this part number identification is recorded with the response pattern produced when testing the reference card, and therefore Part Number Switches PNS include a read-out via line 127 to Read Lines RL and to the I/O Word Control Unit 6.

Figure 6:
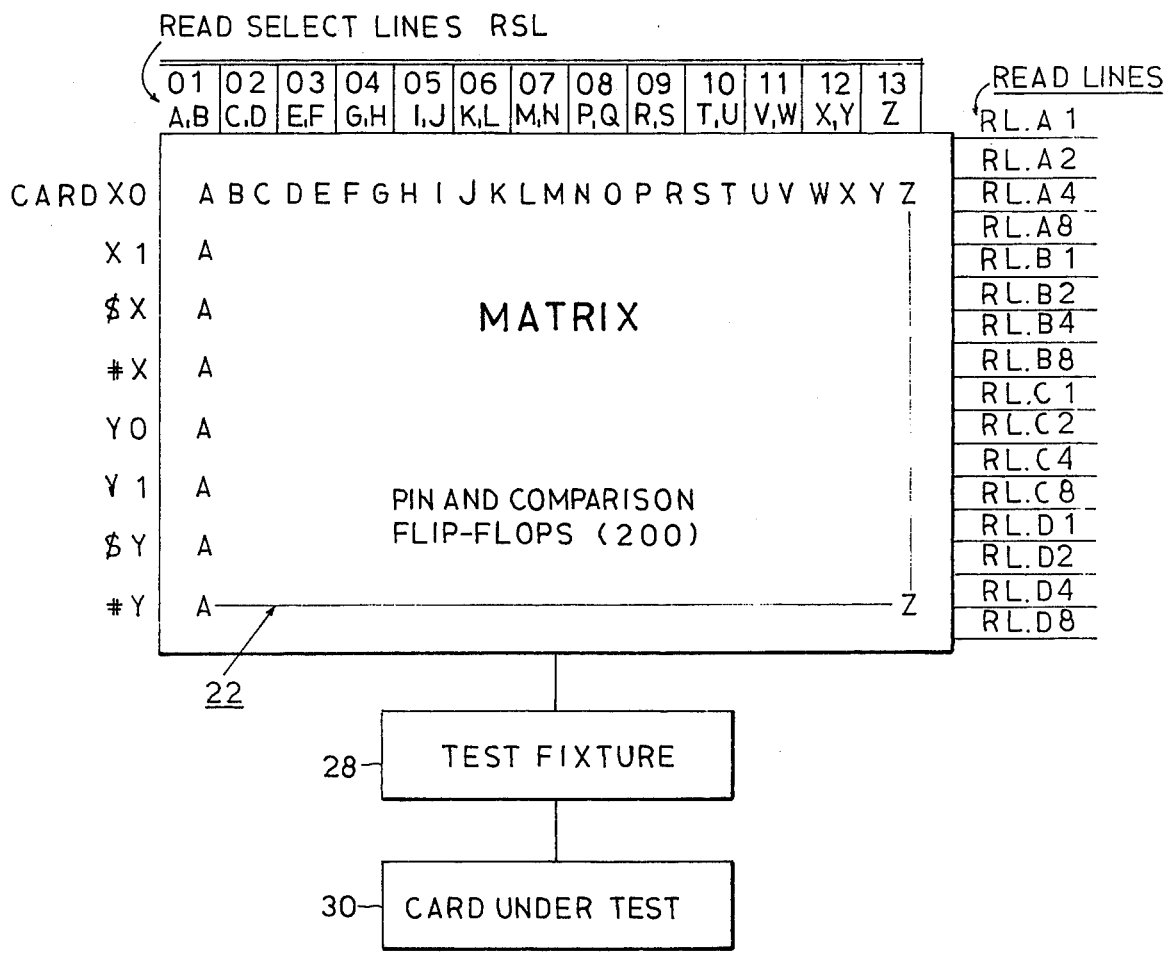
FIG. 6 illustrates one of the matrix cards used in the apparatus of FIGS. 3 and 4.

FIG. 6 illustrates one of the eight matrix cards FFM briefly described above, each of which contains the pair of flip-flops (called respectively the "pin" and "compare" flip-flops) and the associated circuitry for one group of 25 of the 200 pins being tested. As also described above, each of the pins is identified by one of the 25 alphabetical letter designations (i.e., A-Z, except "0," Table 3) and each card is identified by one of eight group designations (i.e., $X_O$, $X_1$, $Y_O$, $Y_1$... etc., Table 2).

Briefly mentioned above was the fact that each matrix card FFM includes 13 Read Select Lines RSL. This is more clearly illustrated in FIG. 6, wherein it will be seen that there is one Read Select Line RSL for the pins of each two adjacent alphabetical characters, except for the last Read Select Line RL (13) which is allocated only to the "Z" pin. Each Read Select Line scans the pair of flip-flop circuits of the same two pins on all eight matrix cards FFM at the same time. Thus, the first Read Select Line RSL (01) scans the flip-flop circuits of the "A" and "B" pins, RSL (02) scans those of the "C" and "D" pins, and so on, RSL (13) scanning only those of the "Z" pins.

It will thus be seen that each Read Select Line RSL scans the status of the flip-flop circuits of 16 pins, namely, those of two pins on each of the eight cards FFM. The status of the flip-flop circuits of the 16 pins is read out to the I/O Word Control Unit 6 via the 16 Read Lines RL to define a 16-bit word. These Read Lines RL are also illustrated to the right of the matrix in FIG. 6, there being four Read Lines for each of the four "A," "B," and "C," and "D" groups of bits of the word. The manner of reading out the status of the flip-flop pairs for two pins is more particularly shown in FIG. 8 illustrating the circuitry for two of such pins.

Portion of Analyser Circuit for Testing Two Pins

FIG. 8 illustrates the portion of the analyser circuit involved in testing two of the 200 pins of the printed circuit card, namely the inputs pin $Y_OA$ and the output pin $Y_OB$ of AND-gate 100. While this circuit will be described more fully below with respect to a detailed description of the operation of the system, particularly the Automatic Test (GO, NO-GO) Mode, the following brief description of FIG. 8 will be helpful in better understanding the construction of the overall system.

AND-gate 100, which is being tested in the example described below, is shown in FIG. 8 as contained in the printed circuit card 30 beng tested, the latter card being supported in the fixture 28. As indicated above, pin $Y_OA$ is the input pin of AND-gate 100, and pin $Y_OB$ is the output pin of that gate.

FIG. 8 illustrates only the portion of the Flip-Flop Matrix FFM card containing the "pin" and "comparison" flip-flops and associated circuitry, for the pins $Y_OA$ and $Y_OB$. The flip-flop pairs for pins $Y_OA$ and $Y_OB$ are shown, respectively, by blocks FFMa and FFMb.

The specific matrix card (one of eight) is selected by the signal from the Card Select Decoder CSD (FIG. 7), this signal being applied via line 120 to gate G1. The latter gate is enabled by the matrix clock from the I/O Word Control Unit 6 via line 128. The specific pin (one of 25 on the selected matrix card) is selected by the signal from the Pin Select Decoder PSD. The signal for selecting the "A" pin is shown in FIG. 8 on line 121a to gate G2 (FIG. 8), and the signal for selecting the "B" pin is shown on line 121b to gate G3. Gates G2 and G3 are both enabled by gate G1, namely by the presence of the Card Select signal on line 120 and the matrix clock on line 129. As will be described below, this clock does not reach gate G1 when the Error Flip-Flop EFF is set, and therefore this gate is disabled at that time.

The specific stimuli to be applied to the flip-flop pair (e.g., FFMa, FFMb, FIG. 8) of the selected pin on the selected card determined by the decoded output from the Mode Select Decoder MSD (FIG. 7). The decoded signals from MSD are applied via lines 124 to both pairs of flip-flops FFMa and FFMb. Thus, the signals applied to the "J" and "K" terminals of the "pin" flip-flops of FFMa and FFMb are fed via line 124 (JP) and line 124 (KP), respectively; and the signals applied to the corresponding terminals of the "comparison" flip-flops of FFMa and FFMb are fed via line 124 (JC) and line 124 (KC), respectively.

The flip-flop pairs FFMa and FFMb are clocked by the SC05C3 clock pulses enabled when the Error Flip-Flop EFF is reset and supplied via line 129 and gates G2, G3 respectively. Both flip-flop pairs FFMa and FFMb, as well as all the others of the Flip-Flop Matrix FFM, are reset by the CLEAR signal supplied from the Clear Decoder CLD via line 123. In addition to clearing these flip-flops at the end of each test, the program may include a CLEAR word as set forth in Table 5 above. Further, all the flip-flops of the matrix FFM are cleared by depressing the CLEAR button 76 (FIG. 5) on the control panel, the clearing being effected by the common clock on line 122.

The "pin" flip-flop of pair FFMa is connected via buffer B1 to input pin $Y_OA$ of AND-gate 100 being tested, and the "pin" flip-flop of pair FFMb is connected vai buffer V2 to output pin $Y_OB$ of AND-gate 100. The juncture of buffer B1 and input pin $Y_OA$ is connected to a restorer R1 so that the output of the restorer reflects the condition of input pin $Y_OA$. Similarly, the juncture of buffer B2 and output pin $Y_OB$ is connected to restorer R2, so that the output of that restorer reflects the condition of output pin $Y_OB$.

The output of each restorer R1, R2 is fed to two devices, namely a gate (G6 for restorer R1, and G7 for restorer R2) effective during the the Generation Mode of operation, and a Pin Status Comparator PSC effective during the Test Mode of operation.

During the Generation Mode, gates G6 and G7 are enabled by the Read Select Lines RSL from the Decimal Counter DC to read-out the status of the respective $Y_OA$ and $Y_OB$ pins to the I/O Word Control Unit 6 via the Read Lines RL. FIG. 8 only illustrates the first (O1) of the 13 Read Select Lines RSL, this line being connected to both gates G6 and G7 as the enabling inputs to them. As described earlier particularly with reference to FIG. 6, Read Select Lines RSL (01) is allocated to the flip-flop pair and associated circuitry of the "A" and "B" pins. FIG. 8 illustrates only two of the 16 read lines RL, these being RL (C1) allocated to pin $Y_OA$ and controlled by gate G6, and RL (C2) allocated to pin $Y_OB$ and controlled by gate G7.

The pin status comparator PSC is enabled during the Test Mode by means of a COMPARISON ENABLE signal applied via line 128 to gate G8 in the circuit of the "comparison" flip-flop of pair FFMa and to gate G9 in the circuit of the "comparison" flip-flop of pair FFMb. The COMPARISON ENABLE signal on line 128 is generated from the Test Flip-Flop TFF (FIG. 7) whenever the inputted word includes bit D1, this bit specifying that a test is to be executed. The outputs of gates G8 and G9 are applied to the Pin Status Comparator PSC with the outputs of restores R1 and R2.

Pin Status Comparator PSC is an integrated circuit unit including two separate adder/subtractor circuits with a common mode control, for example Fairchild/CTL 9822. The Modes and Carry input lines are unused, so that the two stages of PSC are always performing binary addition. The upper stage of Pin Status Comparator PSC is allocated to pin $Y_OA$. Its "A1" input is connected to the circuit of the "comparison" flip-flop of pair FFMa via gate G8, and therefore reflects the status of the "comparison" flip-flop circuit of FFMa when a COMPARISON ENABLE signal appears on line 128 from Test Flip-Flop TFF; whereas its "B1" input is connected to restorer R1, and therefore reflects the actual status of input pin $Y_OA$ of the tested AND-gate 100. The lower stage of Pin Status Comparator PSC is allocated to pin $Y_OB$. Its input "Ao" is connected to the "comparison" flip-flop circuit of pair FFMb via gate G9, and its input "Bo" is connected to restorer R2 so as to reflect the actual status of output pin $Y_OB$ of the tested AND-gate 100.

In each of the two stages of the Pin Status Comparator PSC, both the Sum output (S) and the Propagate output (P) have an EXCLUSION-OR relationship with their respective inputs. Thus, in the lower, $Y_OB$ stage, So and PO would both be "0" if both or neither of their Ao and Bo inputs are "1," and would be "1" if but one of their inputs is "1". Similarly, in the upper $Y_OA$ stage, the P1 and S1 outputs would be "0" if both or either of their inputs B1 and A1 is "1," and would be "1" 1 if but one of their inputs is "0".

The Sum Output (S) of the Pin Status Comparators PSC for the 25 pins "A" to "Z" are OR-wired to each matrix card FFM and are tied to the common line 113, so as to produce an ERROR signal should any output "S" a "1". As indicated earlier, this ERROR signal is applied to Error Flip-Flop EFF via lines 113, 112 (FIG. 7), and sets that flip-flop.

The Propagate outputs (Po, P1) are connected to the light indicators 60 on the control panel 26 (FIG. 5) for the respective alphabetically-identified pins.

Figure 9:
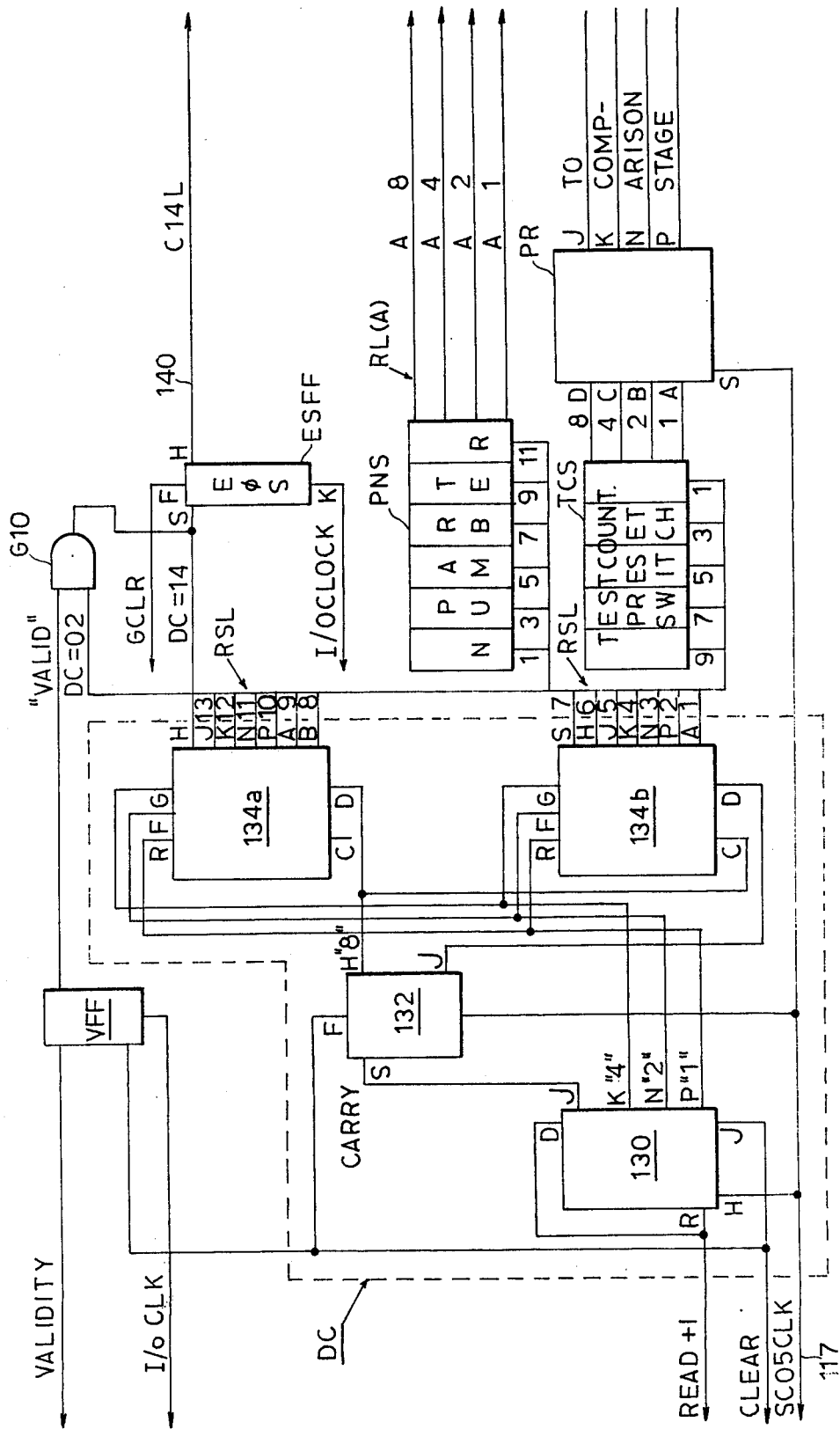
FIG. 9 is a block diagram illustrating the Decimal Counter portion of the analyser circuit of FIG. 7 and the means for reading in the part number of the card being tested.

Decimal Counter Portion of Analyser Circuit (FIG. 9)

FIG. 9 illustrates in more detail the portion of the analyser circuit of FIG. 7 which includes the Decimal Counter DC, the Test Counter Preset Switch TCS, and the Part Number Switch PNS.

The Decimal Counter DC comprises a three-bit register 130 (e.g., Intel 3405) working in the "Add" mode, and a JK flip-flop 132. The binary value in Decimal Counter DC is decimally decoded by two 1-of-8 decoders 134a, 134b (e.g., Fairchild/CTL 9838). The outputs of the two decoders constitute the 13 Read Select Lins RSL (1-13) connected to the Flip-Flop Matrix FFM as shown in FIGS. 6 and 7.

Incrementing Decimal Counter DC from 1-13 successively scans the Read Select Lines RSL (1-13). The 14th count of Decimal Counter DC is applied via line 138 (FIGS. 7 and 9) to the End-of-Sequence Flip-Flop ESFF, which produces an output signal (C14L) on line 140. This signal is fed to the I/O Word Control Unit 6 and causes the latter unit to go into a sequence (called SC=14 and SC=15 sequence) which ends with sending the GENERAL CLEAR level signal (GCLR) via line 104 (FIGS. 7 and 9) to the analyser, as will be described more fully below.

Decimal Counter DC is incremented (by the Sc=05CLK clock applied via line 117) whenever the Validity Flip-Flop VFF is in its set condition. The latter Flip-Flop is in turn set by the VALID signal inputted on line 110 in the Generation Mode. However, in the Automatic Test Mode (GO, NO-GO) the Validity Flip-Flop VFF remains reset, and therefore the Decimal Counter is not incremented as indicated above and as will be described more fully below.

FIG. 9 illustrates how the Decimal Counter DC is used for decoding the part number as preset by Part Number Switch PNS and also for decoding the Test Counter as preset by Test Counter Preset Switch TCS.

Thus as shown in FIG. 9, the first Read Select line RSL (1) output from decoders 134a, 134b of the Decimal Counter DC is connected both to the Part Number Switch PNS and the Test Counter Preset Switch TCS. The decoded binary value of the bits, 1, 2, 4, 8, of the lowest part number digit preset by Part Number Switch PNS is fed, via the four "A" Read Lines RL (A) (these being the only Read Lines shown FIG. 6), to the I/O Word Control Unit 6. This is done at the appropriate time of the Read Loop as to be described below. The decoded binary value of the bits 1, 2, 4, 8 of the lowest digit preset by the Test Counter Switch TCS is held in the Preset Register PR (FIGS. 7 and 9).

Preset Register PR is a four-bit register (e.g., Intel 3406) which stores the number preset by the Test Counter Switch TCS. The Test Counter TC is incremented one count each cycle involving a test operation. The count is Preset Register PR is compared in Comparison Circuit CC with the count in Test Counter TC (see FIG. 7), and when they are equal, a signal is supplied via line 125 to set Error Flip-Flop EFF, briefly described above.

Each incrementing of the Decimal Counter DC causes, via its decoder units 134a, 134b, a digit of both the Part Number Switch PBS and of the Test Counter Preset Switch TCS to be scanned by the Read Select Lines (RSL). However because PNS includes only six digits and TCS includes only five digits, only the odd Read Select Lines RSL are used for this purpose.

After the six middle digits of the Part Number Switch PNS have been transferred to the I/O Word Control Unit 6, and the five digits of the Test Counter Preset Switch TCS have been stored in the Preset Register PR, the Decimal Counter DC will have been incremented to "14." At that time, it sends a signal via line 138 (FIGS. 7 and 9) to the End-of-Sequence Flip-Flop ESCFF to set same, producing the C14L level signal on output line 140, which is sent to the I/O Word Control Unit 6.

As will be described below, when I/O word Control Unit 6 receives the C14L signal, it goes into its SC=14 sequence, and then into its SC=15 sequence, the latter sending the General Clear level signal (GCLR) to the analyser via line 104 (FIGS. 7, 9). This sets the Clear Flip-flop CFF. After a clock pulse the Decimal Counter DC is reset to zero, and the End-of-Sequence Flip-Flop ESFF is reset.

Figure 10:
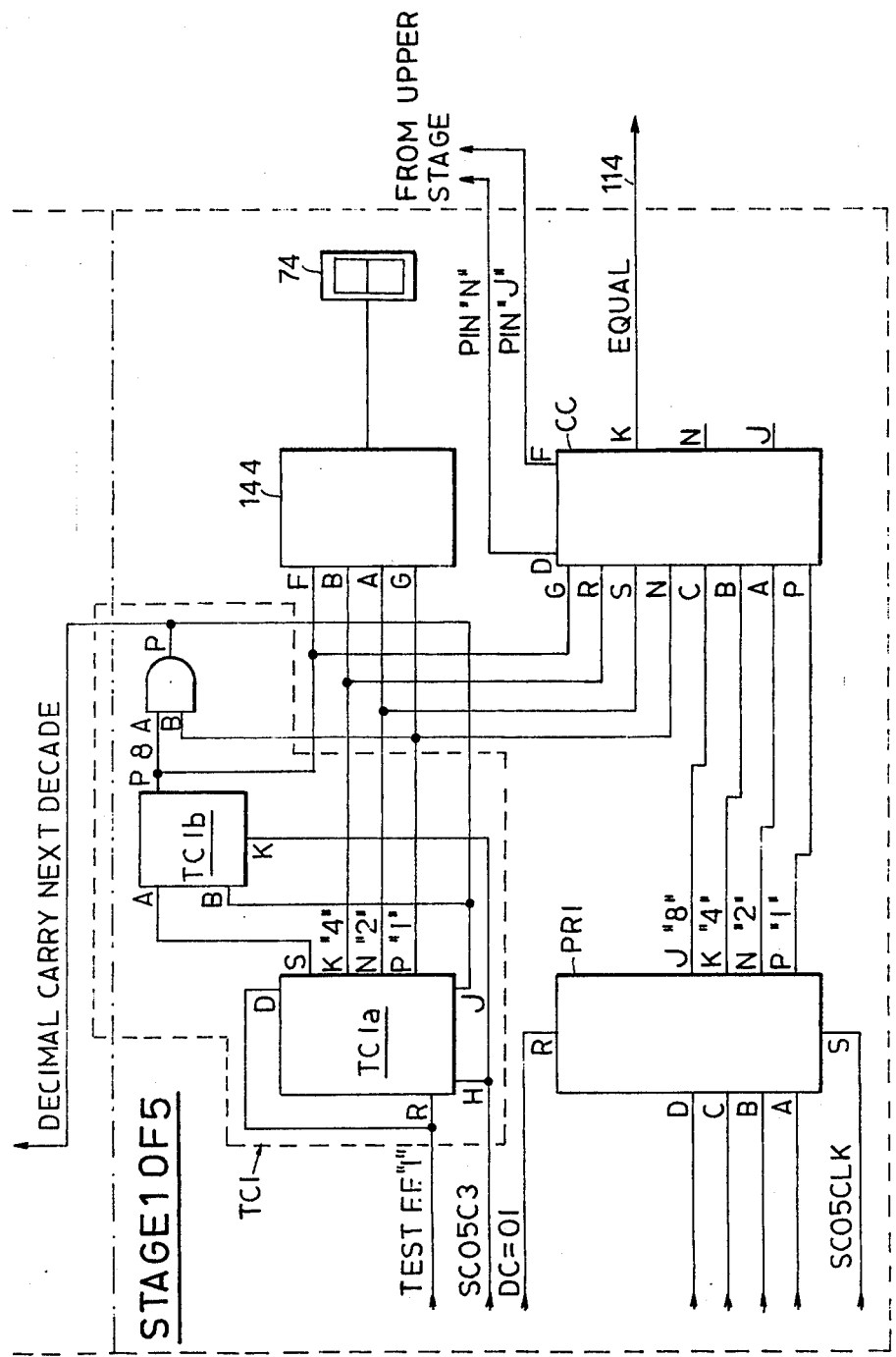
FIG. 10 is a block diagram illustrating the Test Counter and the Preset Register portion of the analyser circuit of FIG. 7.

Test Counter and Preset Register Portion of Analyser Circuit (FIG. 10)

FIG. 10 illustrates the portion of the circuit of the analyser including the Test Counter TC, the Preset Register PR, and the Comparison Circuit CC, all as shown in the lower part of FIG. 7. For the sake of simplifying the description, FIG. 10 illustrates only one of the five decimal digit stages of the Test Counter TC and of the Preset Register PR, this being stage TC1 of the Test Counter and stage $PR_1$ of the Preset Register. FIG. 10 also illustrates the corresponding digit 74a of the Test Counter Display 74 in the control panel (FIG. 5).

The one stage $TC_1$ of the Test Counter TC illustrated in FIG. 10 includes a three-bit register $TC_1a$ (e.g., Intel 3405 working in the ADD mode), and a flip-flop $TC_1b$ (e.g., Fairchild/CTL 9828). The carry input of the latter flip-flop, and the Add Mode Select terminal of register TC1a, are "1" whenever the Test Flip-Flop TFF (FIG. 7) is in its set ("1") condition. As mentioned earlier, the Test Flip-Flop TFF is set whenever A D1 bit is present in the test word, this bit commanding a test operation, and therefore the Test Counter TC is incremented each time a test operation is performed.

The four binary bits of each digit of the Test Counter TC drive a seven segment decoder 144 (e.g., Fairchild/CTL 9823), and the decimal value is displayed on the control panel 6 by the seven-segment display indicator 74 thereon.

The value contained in Test Counter TC is fed into a 4-bit register (e.g., Fairchild/CTL 9824) of the Comparison Circuit CC, and a parallel comparison is made with the value contained in Preset Register PR. If during the test, the value in Test Counter TC is equal to that in Preset Register PR, an EQUAL level signal is applied from Commparison Circuit CC via line 114 to the Error Flip-Flop EFF (FIG. 7) to "set" same with the next I/O clock from line 115, thereby terminating the test.

I/O Word Control Unit 6 Timing (FIGS. 11 and 12)

FIG. 11 illustrates the timing of the various clock pulses, sequence signals, and signal levels involved in a READ operation as controlled by the I/O Word Control Unit 6. FIG. 11a illustrates the corresponding analyser timing in a Part Number Read Operation; and FIG. 11b illustrates the corresponding timing in a Read Matrix Operation. These timings of FIGS. 11, 11a and 11b are designated by the prefix "RT" (Read Timing).

FIG. 12 illustrates the timing as controlled by the I/O Word Control Unit 6 during a WRITE operation. FIG. 12a illustrates the corresponding analyzer timing during a Write one Word Operation; and FIG. 12b illustrates the corresponding analyser timing during a GO, NO-GO operation. These timings of FIGS. 12, 12a and 12b are designated by the prefix "WT" (Write Timing).

With reference first to FIG. 11 illustrating the READ timing by the I/O Word Control Unit 6, the I/O CLK (clock) is illustrated at RT1, and may be for example 1.5 MHz. Each READ loop includes six I/O clocks. The timing of sequence SC=03 R.Sel. (Read Select) of the I/O Word Control Unit 6 is illustrated at RT2, this signal being at a high level during the READ Command to set the Read/Write Flip-Flop RWFF (FIG. 7) which enables the READ to take place. Another sequence controlled by the I/O Word Control Unit is the SC=05 CLK shown at RT3, which performs a number of gating functions including incrementing the Decimal Counter DC and the Preset Register PR, as shown in FIG. 9. The clock which gates the actual READ into the memory is STROBECLK, shown at RT4 in FIG. 11. The timing of the 16 Read lines RL (FIGS. 6, 7, and 9) from the analyser to the I/O Word Control Unit 6 is shown at RT5, and the timing of the reading of the information from the I/O Word Control Unit into the memory is shown at RT6. Finally, FIG. 11 illustrates at RT7 the timing for sequence SC=14, and at RT8 the timing for the SC=15 sequence which produces the General Clear signal (GLCR). The latter are involved in the End-of-Sequence phase of each operation, as will be described more fully below.

FIG. 11a illustrates the corresponding analyser timings during the Part Number Read Command. Thus, RT9 illustrates the timing of the Read Flip-Flop, which is actually the "set" condition of the Read/Write Flip-Flop RWFF, this flip-flop being "set" by the READ signal on input lines 106 (FIG. 7); RT10 illustrates the timing of the Decimal Counter DC; RT11 illustrates the timing of the 13 Read Select Lines RSL 1-13 to the Flip-Flop Matrix FFM as shown in FIGS. 6 and 7; RT12 illustrates the timing of the 16 Read llines RL from the Part Number Data to the I/O Word Control Unit 6; RT13 illustrates the timing of the Preset Register PR (FIG. 7); and RT15 illustrates the timing of the End-of-Sequence Flip-Flop ESFF (FIG. 7).

FIG. 11b illustrates the corresponding timings involved in a Read Matrix 11b for reading the Flip-Flop Matrix FFM. Thus, as shown by timing RT9 in FIG. 11b, the reading of the matrix occurs during the time the Read/Write Flip-Flop RWFF is "set," as shown by the corresponding timing RT9 in FIG. 11a. In addition, FIG. 11b illustrates the timing RT10 of the Decimal Counter DC during a Read Matrix operation. The timing of the 13 Read Select Lines RSL 1-13 is shown at RT16, and that of the 16 Read lines RL1-16 from the matrix FFM is shown at RT17, the latter substantially corresponding to the timing (RT10) of the Decimal Counter DC. Finally, the timing RT15 of the End-of-Sequence signal in the Matrix Read Operaion (FIG. 11b) is the same as in the Part Number Read Operation as shown in FIG. 11a.

Now described are the timings by the I/O Word Control Unit 6 during a WRITE Operation as illustrated in FIGS. 12; 12a and 12b.

In FIG. 12, the I/O CLK (clock) is shown by timing WT1, this being the same as the I/O clock RT1 in FIG. 11.

The timing of the SC=03 sequence is shown at WT2 W.SEL (Write Select), this signal being at a high level during the WRITE command supplied via line 108 to reset the Read/Write Flip-Flop RWFF of FIG. 7 as described above.

At WT3 in FIG. 12, there is shown the timing of the SC=05 CLK sequence which clocks the Error Flip-Flop EFF via input line 116 (FIG. 7) and which performs a number of gating functions (as RT3, FIG. 11) including incrementing the Decimal Counter DC and the Preset Register PR (FIG. 9). At WT4 there is shown the timing of the SC=04C3 sequence which is applied via line 119 in FIG. 7 to clock the matrix flip-flop FFM if the Error Flip-Flop EFF is reset. At WT5, there is shown the timing of the 16 Write Lines WL to the Input Register IR, and at WT6 there is shown the timing of the TRIFCLK signal applied via line 118 (FIG. 7) to clock the Input Register. Finally, there are shown in FIG. 12 at WT7 the timing of the SC=14 sequence, and at WT8 the timing of the SC=15 sequence involved in the End-of-Sequence phase of the WRITE operation, the latter sequence producing the General Clear (GCLR) signal applied via line 104.

The analyser timings involved in a Write-One-Word Operation are illustrated in FIG. 12a as follows: at WT9, the timing of the Write Flip-Flop actually the "set" condition of the Read/Write Flip-Flop RWFF) and of the Validity Flip-Flop VFF; at WT10, the timing of the Decimal Counter DC; at WT11, the W.L. INF WORD timing in which the word bits are inputted into the Input Register IR via Write Lines WL; at WT12, the REG-WORD timing of inputting a word into the Input Register; at WT13, the timing of the changes in the Flip-Flop Matrix FFM; and at WT14, the timing of the End-of-Sequence Flip-Flop ESFF.

FIG. 12b illustrates the corresponding analyser timings during a GO, NO-GO Automatic Test Operation.

Thus, there are shown: at WT9, the timing of the Write Flip-Flop (actually the "set" condition of the Read-/Write Flip-Flop RWFF, FIG. 7) in the Write-One Word Operation; at WT12, the timing in which the words are inputted into the input Register IR (here, a plurality of words are inputted rather than the one word in the previous operation); and at WT13 and WT14, the timing of the changes in the matrix flip-flops (FFMa, FFMb, FIG. 8). In the previous operation only the change in the "pin" flip-flop of the matrix is shown (WT 13, FIG. 12a) whereas in this Go, NO-GO operation of FIG. 12b, the change in the "comparison" flip-flop is also shown, at WT15, since this is significant in this operation as will be described below. Further shown in FIG. 12b are: at WT16, the timing of the Test Flip-Flop TFF (which, as described above, enables the comparison of the state of the "pin" and "comparison" flip-flop circuits of the Flip-Flop Matrix); at WT17, a stability time; at WT18, the timing of the ERROR level (controlled by the Error Flip-Flop EFF); at WT19, the timing of the Error Flip-Flop EFF; and at WT14, the timing of the End-of-Sequence Flip-Flop ESFF.

The foregoing timings illustrated in FIGS. 11 and 12 are described more particularly below with respect to each of the Modes of Operation of the system illustrated.

GENERAL OPERATION OF ILLUSTRATED EMBODIMENT

Operations in General

The system illustrated, as noted above, is capable of performing a complete test procedure in which it first operates according to the Generation Mode wherein a reference test pattern is generated and stored from a series of test stimuli applied to a reference or master card known to be without faults, and then according to the Test Mode wherein a production card to be tested is subjected to the same test stimuli and its actual responses are compared to the stored reference responses, any discrepancies between the two indicating a fault in the production card. Actually, there are two permissible Test Modes, one being an Automatic (GO, NO-GO Test Mode in which the tests are serially applied and are automatically interrupted upon the uncovering of a fault in the production card, the second being a Manual Test (Troubleshooting) Mode in which tests are selectively applied to locate the fault.

Each card to be tested by the system is identified by a part number designation. This is inputted into the system during the Generation Mode via the manually presettable Part Number Switch PNS on the control panel (FIG. 5), and is stored with the reference card; when the production card of the same part number is to be tested, the part number designation is again manually inputted into the system and is used to extract from the memory the reference test pattern applicable to that part number.

Each of the foregoing operations is described in detail below with respect to a specific example.

The test stimuli used in both the Generation Mode and the Test Mode are in the form of a series of coded instructions forcing the card to perform all the logic functions involved in the card being tested. In the example described below, these coded instructions are in the form of 16-bit words, the format of which is described above under the section titled "Test Word Format," and illustrated in Tables 2–6. Each test word or stimulus is addressed to a selected pin (one of 200) of the card (the reference card during the Generation Mode, and the production card during the Test Mode), and then all the pins of the card are scanned for their responses to the test stimulus. Whenever a pin changes its condition as a result of the test stimulus, this is noted and recorded as the response to the test stimulus.

Figure 13:
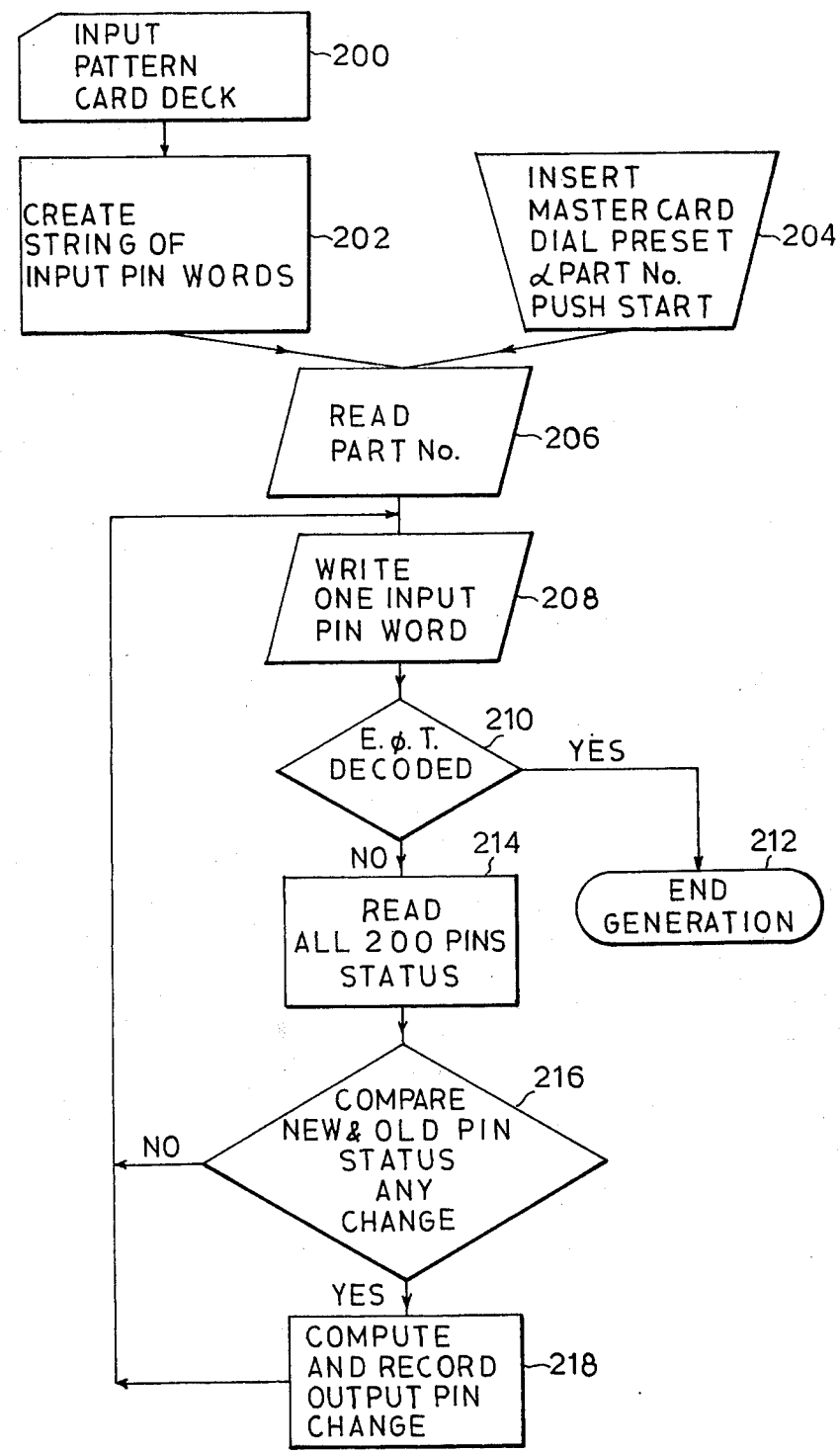
FIG. 13 is a flow diagram illustrating the Generation Mode of operation of the apparatus.
Figure 14:
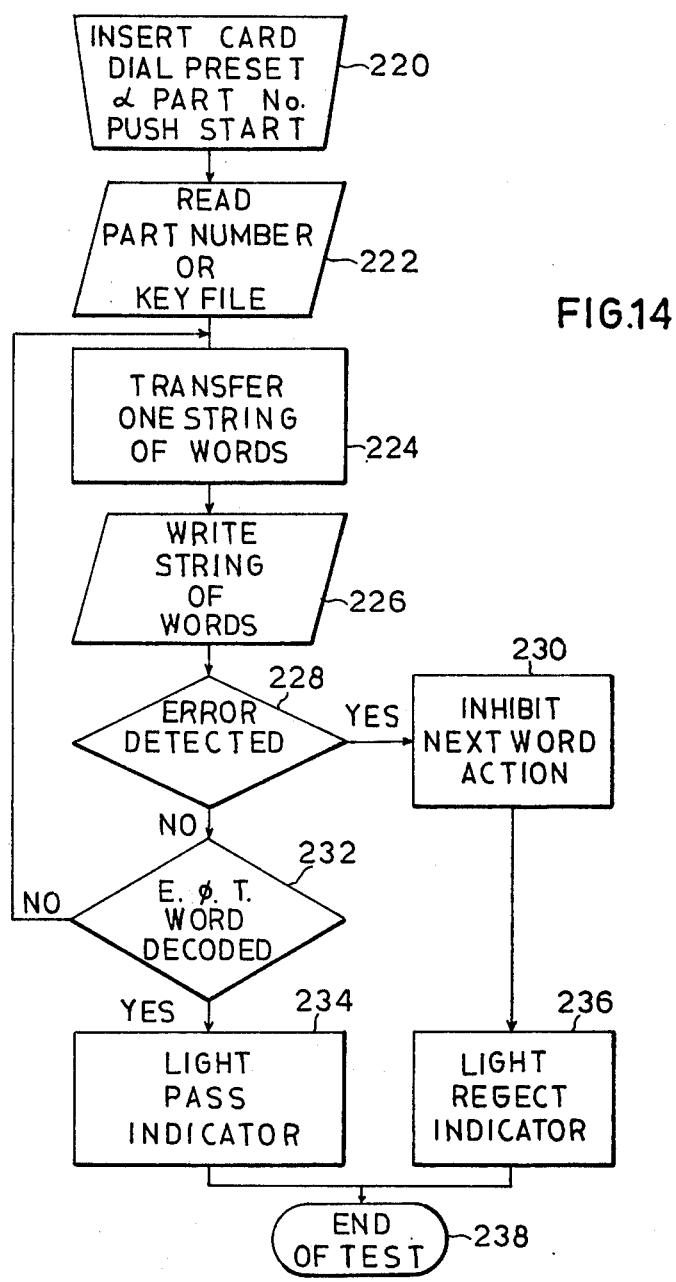
FIG. 14 is a flow diagram illustrating the Automatic Test (GO, NO-GO) Mode of operation of the apparatus.

FIG. 13 is a flow diagram illustrating the Generation Mode of Operation of the apparatus, and FIG. 14 is a flow diagram illustrating the Automatic Test (GO, NO-GO) Mode of Operaton. Specific reference to these flow diagrams will be made in the detailed description below of the respective operations.

The system illustrated is not restricted to one specific test program but is capable of operating according to many different test programs. Accordingly, setting forth a complete test program is not essential for an understanding of the present invention and would merely unduly lengthen the description. In order to illustrate the use of the described apparatus in the general test procedure, however, the description below sets forth the specific procedure for testing one element of the printed circuit card, namely AND-gate 100 (FIG. 8) whose input and output pins are designated $Y_oA$ and $Y_oB$ respectively. The other elements of the card would be similarly tested by providing the appropriate program in accordance with the specific elements involved.

As briefly described above, AND-gate 100 is tested by causing its input pin to be "1," at which time its output pin should also be "1," and then by causing its input pin to be "0," at which time its output pin should follow and also become "0."

Thus, the testing of AND-gate 100 requires a minimum of four instruction steps as follows:

TABLE 7

(1) WRITE a word (a "cause" or test word) to force a "1" at the input pin $Y_oA$ of the AND-gate;
(2) READ The while matrix, and find that only the status of output pin $Y_oB$ was changed (to "1"), this being recorded as the "result" or response word;
(3) WRITE another word ("cause" or test word) to force a "O" at the input pin $Y_oA$; and
(4) READ the whole matrix, and find that only the condition of the output pin $Y_oB$ was changed (to "O"), this being recorded as the "result" or response word.

As brought out earlier, when making an automatic GO, NO-GO test, the "result" or response must be declared before the "cause" or test-stimulus, since it is the "cause" word which commands the comparison (by bit D1 of the test word), and therefore in the test program the result or response word precedes the cause or test-stimulus word.

Preliminary Procedures

In the embodiment of the invention illustrated in the drawings, the test stimuli are in the form of coded instructions which are punched into a card deck, as shown by block 200 in FiG. 13. These instructions are inputted into the system by means of a card reader (10, FIG. 1) cable-connected to a general-purpose, medium-scale computer, such as a Burroughs B3700. The computer is programmed to produce a string of test words (shown by block 202 in FIG. 13) from the inputted coded instructions. These test words are applied to the pins of the card being tested, this being the reference card in the Generation Mode and the production card during the Test Mode. Each test word is decimally decoded in the apparatus to specify the specific one of the eight Flip-Flop Matrix cards (FFM, FIG. 7), the specific one of the 25 pins on the respective matrix card, and the specific test stimulus or command to be applied to that pin. This is generally described above under the section titled "Test Word Format" and will be further described below.

The card PC (FIG. 4) being tested (whether it is the reference card in the Generation Mode or a production card in the Test Mode) is inserted into connector 44 (FIG. 4b) of the test fixture 28, which connector makes the necessary connections the back-plane pins 42, shown at the bottom of the card in FIG. 4. The front-plane pins 42, shown at the top of the card in FIG. 4, are connected by the use of an adapter card AC (FIG. 4a) inserted into connector 46 of the test fixture, the connections being made by flat cables 48 from the adapter card AC to the front-plane pins of the card PC under test. Flat cables 50 are also used for making the electrical connections from the back-plane connectors 44 and 46 to the analyzer circuitry.

The different voltages required by the card are applied by means of switches 56 (FIG. 4b), and the indicator displays 58 on the test fixture indicate to the operator that the card is correctly powered.

The operator presets the Test Counter Switch TCS (FIGS. 5 and 9) to a number larger than the maximum number of tests involved for the particular part. For example, this may be done by merely moving the highest digit of the five-digit counter to "9," to represent 90,000 tests, the maximum number of tests in this example being about 15,000–20,000 tests.

The apparatus illustrated is operated first according to the Generation Mode to generate and store a reference test pattern from a reference card, and then according to the automatic Test Mode to test each production card with the reference test pattern. If a production card does not pass all the tests, the apparatus may then be operated according to the Manual Test Mode to troubleshooting the fault. The above three Modes of Operation are described below in that order.

The Read Part Number procedure is common to both the Generation Mode and the Test Mode. In the former, it inputs the part number of the reference card and stores it with the reference test pattern generated; and in the latter, it inputs the part number of the production card, and uses the identification to extract the appropriate reference test pattern from the bulk memory in which it is stored. Accordingly, the Read Part Number Procedure will now be described before the specific description of the Generation Mode and the Test Mode.

Read Part Number Procedure

In this procedure, the part number of the card is read into the analyser circuit. As mentioned earlier, in the Generation Mode, this part number is stored in the bulk memory (disk file 8, FIG. 1) with the reference test pattern, and in the Test Mode this part number is used to extract from the bulk memory the reference test pattern corresponding to the production card being tested.

The part number identification is inputted into the system by means of the Part Number Switch PNS illustrated in the control panel 26 of FIG. 5, as well as in the circuit of FIG. 9. Switch PNS has eight digits, but only the six middle digits are significant in the system illustrated and will be read.

After the Test Counter Switch TCS and the Part Number Switch PNS have been preset as described above, the operator presses the START button 78 on the control panel 26 (FIG. 5). As shown in the block diagram of the analyser in FIG. 7, pressing START button "sets" the Start and Ready Flip-Flops SRFF. This energizes the READY indicator 88 on the control panel and produces a READY signal on output line 102 to the I/O Word Control Unit 6.

The I/O Word Control Unit, as indicated earlier, can handle up to 15 testers in a time-shared manner; the enabling signal for the specific one of the 15 tester units is sent to the Start and Ready Flip-Flops SRFF via input line 103 of FIG. 7, thereby enabling that unit for the incoming and outgoing levels with respect to the I/O Word Control Unit.

The program knows that this unit is now "Ready" and initiates the Part Number "Read Command."

The timing of the "Read Command" (constituted by sequence SC=03 R.SEL.) is shown at RT2 in FIG. 11. During this SC=03 sequence of the I/O Word Control Unit 6, the READ level is sent to the analyzer via line 106 (FIG. 7), and the Read/Write Flip-Flop RWFF remains reset, this being its condition during a READ operation.

The first "Read Command" is always a Part Number Read as shown by timing RT9, FIG. 11a. The first SC=05 CLK clock (RT3, FIG. 11) occurs between time t1 and t2 of the Read Loop and performs a number of functions: it clears all the Matrix Flip-Flops MFF; it resets the Test Counter TC (FIG. 10) to "000"; and it increments the Decimal Counter DC (FIG. 9) one unit from "0" to "01."

As described earlier and as shown in FIG. 9, Decimal Counter DC includes a three-bit register 130, a flip-flop 132, and a decimal decoder 134a, 134b providing a "1" – "14" decimal output. The timing of the Decimal Counter DC is shown at RT10, FIG. 11a. Its "1" – "13" outputs are connected (per timing RT11, FIG. 11a) to the 13 Read Select Lines RSL of the Flip-Flop Matrix FFM (FIGS. 6, 7, 9) as well as to the Test Counter Switches TCS and Part Number Switch PNS, as shown in FIGS. 7 and 9. The 14th count from the decoder of Decimal Counter DC is fed to the End-of-Sequence Flip-Flop ESFF as also shown in FIGS. 7 and 9.

The "01" Read Select Line RSL selects the first significant digit of the Part Number Switch PNS and the lower digit of the Test Counter Switch TCS. At the appropriate time, the binary value (bits 1, 2, 4, 8) of the part number digit is fed by the four "A" Read Lines RL (FIG. 7) to the I/O Word Control Unit 6, this occurring during time t2 of the Read Loop (as shown by RT5, FIG. 11 and RT12, FIG. 11a). This value is gated at time t5 (RT6, FIG. 11) by the strobe clock STROBECLK (RT4) from the I/O Word Control Unit 6 into the memory of the computer (4, FIG. 1).

The binary value (bits 1, 2, 4, 8) of the decoded lower digit of the Test Counter Switch TCS is transferred to the Preset Register PR (FIGS. 7 and 9) at time t2 of the next Read Loop (RT13, FIG. 11a) as gated by the SC=05 CLK clock (RT3). This value is continually compared in Comparison Circuit CC (FIGS. 7 and 10) with the value in Test Counter TC; if and when the two values are equal, a signal is applied via line 114 to Error Flip-Flop EFF to terminate the tests, as described above.

The next Read Loop increments the Decimal Counter DC to "02" (RT10, FIG. 11a). However, only the "odd" Read Select Lines RSL are used to decode the other digits of both the Part Number Switch PNS and the Test Counter Switch TCS as shown by RT11, FIG. 11a.

When the six middle digits preset by the Part Number Switch PNS have been transferred to the I/O Word Control Unit 6, and when the five digits preset by the Test Counter Switch TCS have been stored in the Preset Register PR, the Decimal Counter DC will have been incremented up to "14." On the next I/O Clock (RT1, FIG. 11), the End-of-Sequence Flip-Flop ESFF (FIGS. 7 and 9) is "set," and the C14L level (RT15, FIG. 11a) is sent via line 140 (FIG. 7) to the I/O Word Control Unit 6. This causes the I/O Word Control Unit 6 to go to its SC=14 Sequence (RT7, FIG. 11), and then to its SC=15 Sequence (RT8, FIG. 11), the latter sending the General Clear level (GCLR) to the analyser via line 104 of FIG. 7.

The GCLR level "sets" the Clear Flip-Flop CFF (FIG. 7). After a clock pulse, th Decimal Counter DC is reset to zero, and the End-of-Sequence Flip-Flop ESFF is also reset.

The Read Part Number Command ends.

Now will be described in detail the Generation Mode of Operation for generating the reference test pattern, and the Test Mode of Operation for using the generated reference test pattern to test production cards.

GENERATION MODE OF OPERATION

General

FIG. 13 is a flow diagram illustrating the Generation Mode of Operation. As will be recalled, in the Generation Mode a series of test stimuli, preceded by the part number designation, are applied to a reference or master card known to be without faults, and the pattern generated thereby, called the reference test pattern, is stored in the bulk memory with the part number designation.

Referring now to the flow diagram of FIG. 13, it will be seen that the test stimuli in the form of coded instructions punched into a card deck are inputted (step 200) into the system by means of a card reader (10, FIG. 1) cable-connected to the computer (4, FIG. 1) which a indicated above, may be any generally-purpose, medium-scale computer, such as the Burroughs 3700. The computer is programmed to produce a stream of test words (step 202) from the inputted coded instructions. These test words are applied to the pins of the card being tested. The master card is inserted into the apparatus (step 204) in the manner described earlier, and the part number is read (step 206) as also described earlier.

The next step is to Write One Input Pin Word (step 208). This involves transferring the first test word from the computer memory to the analyser Flip-Flop Matrix FFM (FIG. 7). The test word sets the flip-flops of the flip-flop pairs (FFMa, FFMb, FIG. 8) of the selected pin, according to the instruction, all as specified in the test word.

The next step (210) is to determine whether the End-of-Test has been reached; if "yes", an End-of-Test signal is generated (step 212) to terminate the test; if "no," the sytem proceeds to the next step, which is to read the complete Flip-Flop Matrix FFM, i.e., the flip-flop circuits of all the pins (200), to determine the status of all the pins as a result of the instruction applied in step 208. The system then compares the new and the old pin status (step 216) and determines whether any changes have occurred. If no changes have occurred, the system returns back to the beginning of step 208; if a change has occurred, the change is determined and recorded (step 218) as an output pin change, and then the system returns back to the beginning of step 208.

In step 218, therefore, there is determined and recorded the response to the test stimulus applied in step 208.

Each of the foregoing steps will now be described in more detail.

Write-One-Input Pin Word

This operation is started by the program giving a WRITE command (step 208, FIG. 13) to the I/O Word Control unit 6, to transfer the first word from the memory to the analyser Flip-Flop Matrix FFM. This transfer is effected via the 16 Write Lines (WL), Input Register IR, decoders CSD, PSD, CPD, CLD and MSD, to the selected Flip-Flop Matrix card FFM, all as illustrated in FIG. 7.

The example hereinafter described concerns the testing of AND-gate 100 (FIG. 8) which, as noted above, requires a minimum of four 16-bits words, involving the four instruction steps as set forth in Table 7 above.

Table 6 above sets forth the four words involved in performing the four test steps of Table 7 in order to test AND-gate 100.

As pointed out above, in the GO, NO-GO Test Mode a response (or "result") word must be declared before the test (or "cause") word, since it is the test word which contains the data bit (D1, Table 4) commanding the comparison test. Accordingly, the reference pattern generated in the Generation Mode contains the response word before the test stimulus word. From Table 6 above it will be noted that Word 2 is the test stimulus and specifies that it is to be applied to make pin $Y_oA$ "true", the proper response to that stimulus being Word 1 which is that pin $Y_oB$ is to be "true". It will also be noted that Word 2 includes the test data bit D1 (decimal "7" decoded) commanding the comparison test to be made, but this is not effective in the Generation Mode and is effective only in the Automatic (GO, NO-GO) Test Mode.

Thus, at the beginning of the Generation Mode, the response (Word 1) has not yet been generated, and therefore the first word to be transferred from the memory to the analyser Flip-Flop Matrix FFM, upon the program giving a WRITE command, is Word 2 (Table 6) in the example, namely "2217".

Word 2 ("2217") sets the flip-flops of pair FFMa (FIG. 8) for pair $Y_oA$ (FIG. 8) and forces a logical "1" at the input (pin $Y_oA$) of AND-gate 100, in the following manner, reference being made particularly to FIGS. 7 and 8 and to the timing diagrams of FIGS. 12 and 12a.

During the SC=03 sequence (WT2, FIG. 12) of the I/O Word Control Unit 6, the WRITE and VALIDITY levels (WT9, FIG. 12a) are fed to the analyser via lines 108 and 110, respectively (FIG. 7); at the same time the unit designation is supplied to the analyser via line 103. The analyser is still in the READY condition from the previous Read Part Number Operation. The Read Write Flip-Flop RWFF is set by the WRITE signal applied via line 108, and the Validity Flip-Flop VFF is set by the validity signal applied via line 110, the timing being shown at WT9, FIG. 12a. Also, the TEST indicator light 92 on the control panel 26 (FIG. 5) is energized.

The WRITE cycle starts at time $t1$ (WT1) of the SC=05 CLK (WT3, FIG. 12). At time $t2$, the Decimal Counter DC is incremented to "01" (WT10). The first SC=05C3 clock (WT4) is not used. The 16 Write Lines WL transfer the data to the Input Register IR (FIG. 7) between time t6 and the next t1, as shown at WT5 (FIG. 12) and WT11 (FIG. 12a), the data being clocked into the Input Register IR by the trailing edge of the TRIFCLK clock pulse (WT6).

The word ("2217") inputted into the Input Register IR is decoded as follows: The four "A" bits (decimal "2") are decoded by the Card Select Decoder CSD (FIG. 7) to specify the Yo matrix card (Table 2), and this information is fed via line 120 to select the Yo Flip-Flop pair FFMa (FIG. 8) for the Yo group of pins; the four "B" and "C" bits are decoded by Pin Select Decoder PSD to specify the "A" pin (Table 3), and this information is fed via line 121 to the Flip-Flop Matrix FFM to select the "A" pin, namely flip-flop pair FFMa; and the four "D" bits are decoded per Table 4 to place the "J" mode of both the "pin" and "compare" flip-flops of FFMa in the "1" (true) status. The J and K modes are common for the flip-flops of all the pairs of the Flip-Flop Matrix FFM.

During t3 of the next WRITE cycle, the SC=05 C3 clock (WT4, FIG. 12) is allowed by the Error Flip-Flop EFF (which is in its "reset" state) to reach the Flip-Flop Matrix FFM via line 128 (FIG. 8) as the matrix clock. Gate G1 (FIG. 8) is enabled by the signal on line 120 from the Card Select Decoder CSD (FIG. 7) and therefore gate G1 passes (and restores) the matrix clock to gates G2 and G3. Since this operation, the "A" pin has been selected by the signal from the Pin Select Decoder PSD, the signal on line 121a in FIG. 8 is "1," therefore gate G2 permits the clock to pass the flip-flop pair for the $Y_OA$ pin (FFMa, FIG. 8). Gate G3, however, does not permit the clock to pass to the flip-flop of the $Y_OB$ pin (FFMb) since the signal on line 121b is "0."

As described above, the J modes of the flip-flops are "true" by the "1" signal applied to the J-lines of input conductors 124 from the Mode Select Decoder MSD decoding the "D" bits of the Test Word; accordingly, both the "pin" and "comparison" flip-flops of pair FFMa for pin $Y_OA$ are "set." The "P" and "H" output terminals of FFMa are therefore driven to "1."

The "1" level of output pin P is fed via buffer B1 to the $Y_OA$ pin of AND-gate 100 in the card being tested in the test fixture 30. At the same time, the "1" level from buffer B1 is fed to restorer R1; the output of restorer R1 thus reflects the logic status of pin $Y_OA$ of AND-gate 100.

This restored level outputted from restorer R1 is fed, via gate G6 which will be enabled by Read Select Line RSL (01), to Read Line RL (C1). The 16 Read lines Rl are more clearly illustrated in FIG. 6, and as indicated above, the "C1" Read Line RL is allocated to pin $Y_OA$.

As also indicated above, the "C2" Read Line RL (FIG. 8) is allocated to pin $Y_OB$. This Read Line is controlled by gate G7, FIG. 8. However, since the "B" pin was not selected by the inputted word (the signal on line 121b being "0"), the $Y_OB$ flip-flop pair FFMb does not receive the matrix clock from gate G3; therefore these flip-flops are "reset," and the "P" and "H" pins of FFMb are "0."

However, the "1" at pin $Y_OA$ of AND-gate 100 forces a "1" at output pin $Y_OB$ of the AND-gate. This "1" is restored by restorer R2 and is applied to gate G7. Gate G7 is also enabled by Read Select Line RSL (01) since that line is allocated to both the "A" and "B" pins as shown in FIG. 6, and therefore a "1" output will appear on the "C2" Read Line RL allocated to the $Y_OB$ pin.

It will thus be seen that restorer R1 reflects the status of the $Y_OA$ pin, which is "1" in the example described; and restorer R2 reflects the status of the $Y_OB$ pin, which is also "1" in the example described having been driven to "1" by the AND-gate 100. Thus, a "1" is produced on both the "C1" and "C2" Read Lines Rl in FIG. 8 when the "01" Read Select Line RSL will be selected by the Decimal Counter DC during the Read operation. All the other Read Lines RL will be at "0" as the Read Select lines RSL are incremented by the Decimal Counter DC.

The first input word is followed by a "dummy" word (all bits "0") as shown at WT11, FIG. 12. This dummy word has no action on the Flip-Flop Matrix FFM, but merely clears the Input Register IR.

The End-of-Sequence Flip-Flop ESFF is then set by an AND-gate G10 (FIG. 9), the later receiving signals from the "02" position of the Decimal Counter DC and from the Validity Flip-Flop VFF. The I/O Word Control Unit 6 receives the C14L level ESFF and goes to the SC=14 sequence (WT7) and then to the SC=15 sequence (WT8), producing the General Clear level signal (GCLR) which is fed to the analyzer via line 104. This signal resets the Decimal Counter DC to zero, and also resets the End-of-Sequence Flip-Flop ESFF.

The Write-One-Input Word Operation (Step 208, FIG. 13) is thus completed. Since at this point the program would not include the special End-of-Test Word (Word 7), Table 6 in the above-described example, the system proceeds to the Read Matrix operation, step 214 of FIG. 13.

READ MATRIX OPERATION

The Read Matrix Operation (step 214, FIG. 13) is initiated by a READ command (RT9, FIG. 11b) from the program. In this operation, the complete Flip-Flop Matrix FFM (FIG. 7) is scanned, and the status of the pin flip flops of all 200 pins is recorded in the memory. The timing of the Read Matrix Operation is illustrated in FIG. 11b.

During the SC=03 sequence of the I/C Word Control Unit (RT2, FIG. 11), the READ level is sent to the analyser via line 106 (FIG. 7), and the next I/O clock (RT1) resets the Read/Write Flip-Flop RWFF to the READ status.

The first SC=05CLK clock (RT3, FIG. 11) increments the Decimal Counter DC from "0" to "01" (RT10, FIG. 11b). In this Generation Mode, the Validity Flip-Flop VFF remains set. This causes the Read Select Line RSL (01) to be connected to the Flip-Flop Matrix FFM instead of to the Part Number Switch PNS as described in the above Part Number Read Operation.

As also described above, with reference to FIG. 6, each of the 13 Read Select Lines ("01" to "13") scans the flip-flop pairs of the same two pins on all eight matrix cards 22 at the same time. Thus, Read Select Line RSL (01) scans the flip-flops of the "A" and "B" pins of all matrix cards, RSL (02) scans those of the "C" and "D" pins, and so on through the 13th Read Select Line RSL (13), the latter scanning only the flip-flops of the "Z" pins on the eight cards. Thus, each of the 13 Read Select Lines RSL monitors the status of the pin flip-flops for 16 pins; for RSL (01), the flip-flops monitored are for the "A" and "B" pins of all eight matrix cards 22.

The statuses of the pin flip-flops of the 16 pins (e.g., the "A" and "B" pins on all eight matrix cards 22) are sent to the I/O Word Control Unit 6 via the 16 Read Lines RL illustrated at the right side of the matrix card 22 in FIG. 6. The signal on each Read Line RL defines one bit of the 16 bit-word transferred to the I/O Word Control Unit. Thus, FIG. 6 illustrates four "A" Read Lines RL (A), four "B" Read Lines RL (E), four "C" Read Lines RL (C), and four "D" Read Lines RL (D). These 16 Read Lines are also shown (as a single line) at the output side of the Flip-Flop Matrix FFM in FIG. 7, and as therein shown, are used for reading out the information from the Flip-Flop Matrix FFM to the computer memory via the I/O Word Control Unit 6.

In the example being described, Read Line RL (A1) reflects the status of the flip-flop pair of pin $X_OA$ (FIG. 6); Read Line RL (C1) reflects the status of the flip-flop pair of pin $Y_OA$, this being FFM$a$, FIG. 8; and Read Line RL (C2) reflects the status of the flip-flop pair of pin $Y_OB$, this being FFM$b$, FIG. 8.

As described in the preceding section, after the first word was written (this being Word 2, Table 6, in the Generation Mode), the "pin" flip-flop of pair FFM$a$ of pin $Y_OA$ was forced to "1" by the test word itself, and therefore a "1" appears at the input to restorer R1 connected to the "pin" flip-flop of pair FFM$a$. The response (Word 1) was that pin $Y_OB$ was also forced to "1" by the AND-gate 100 (FIG. 8), the latter "1" appearing at the input to restorer R2 connected to the "pin" flip-flop of pair FFM$b$ for pin $Y_OB$. Thus, a "1" appears on both Read Lines RL (C1) and RL (C2). The remaining 14 Read Lines RL are "0," these Read Lines reflecting the status of the flip-flop pairs of the 14 other pins being sensed by the Read Select Line RSL (01).

The data being read out of the Flip-Flop Matrix FFM via the 16 Read Lines RL is gated to the I/O Word Control Unit 6 between time $t1$ and $t2$ (RT1, FIG. 11) of the Read Loop, and is clocked into the memory by the trailing edge of the strobe clock STROBECLK (RT4, RT6, FIG. 11).

The next SC=05 CLK clock (RT3) increments the Decimal Counter DC to the value "02." This advances the Read Select Lines to RSL (02) for sensing the status of the flip-flop pairs of the next 16 pins, namely the "C" and "D" pins of the eight matrix cards 22. Their status is found to be "0," since their status was not changed during the Write-One-Word Operation. Thus, during this second Read Loop, the 16-bit word outputted from the 16 Read Lines designates no status change in the flip-flop pairs being scanned in that Read Loop.

In a similar manner, the Decimal Counter DC is incremented through the next 11 counts, each count producing a Read Loop in each of which the 16-bit output word from the Read Lines RL designates no change in the flip-flops being scanned, except that in the last (13th) count of the Decimal Counter, the status of only the "Z" pin flip-flop pairs is read out via the Read Lines RL.

Thus, after the completion of the 13th count of the Decimal Counter DC, the logic status of the flip-flop pairs of all 200 pin Flip-Flops of the Matrix FFM is recorded in memory.

At the next SC=05CLK clock (RT3), the Decimal Counter DC is incremented to "14," which sets the End-of-Sequence Flip-Flop ESFF (RT15, FIG. 11$b$). The C14L level is sent to the I/O Word Control Unit 6, which goes into its SC=14 sequence (RT7), and then its SC=15 sequence (RT8), the latter producing the General Clear (GCLR) signal which is fed to the analyser via line 104 (FIG. 7). This resets the Decimal Counter DC to "00" and also resets the End-of-Sequence Flip-Flop ESFF.

The Read-Matrix operation is now completed, and the analyser waits for the next program step, namely the Determine Pin Status Change Operation, step 216 of FIG. 13.

DETERMINE PIN STATUS CHANGE

In the example described, this step (216, FIG. 13) is performed only by the program and does not involve any analyser operation. In this step, the program compares the previous logic states of the 200 pins (where only the logic state of pin $Y_OA$ was "1") with the last READ pattern, and finds that only the logic state of pin $Y_OB$ "changed" (from "0" to "1"). This is recorded as the output pin change or response (Word 1, Table 6) resulting from the test stimulus (Word 2, Table 6) forcing pin $Y_OA$ to "1".

Thus, the test pattern produced from the example described in the above three operations, would be as follows:

TABLE 8

| 234567 | 2220 | 2217 |
|--------|------|------|
| key    | ex 1 | ex 2 |

In the above test pattern, "key" is the part number (6 middle digits) inputted by the Part Number Switch PNS as decoded by the analyser; "ex 1" is the 16-bit response Word 1 (Table 6) translated by the program in step 216 of FIG. 13, this word meaning that the logic state of pin $Y_OB$ was found to be "1" (in the Read Matrix Operation) when the test Word 2 (ex 2) was written into the matrix (during the Write One Word Operation); and "ex 2" is the 16-bit input test Word 2 (Table 6) written to force pin $Y_OA$ to "1" in the previous Write One Word Operation.

It will thus be seen that the word of "ex 1" is a "result" or response word produced in the output of the Flip-Flop Matrix FFM (FIG. 7) as a result of writing into the matrix the "cause" of "ex 2". As mentioned earlier, the "result" word occurs in the generated test pattern before its "cause" word: this is because in the Automatic Test (GO, NO-GO) Operation, the "result" or response word reflecting the change must be declared before the "cause" or test word producing the response, since the test word includes the test bit (D1) which effects the test, i.e., the comparison between the "should be" response and the "actual" response with respect to the particular test stimulus. This will be more fully illustrated below in the description of the Automatic Test (GO, NO-GO) Mode of Operation.

Completion of Generation Mode

The operation described above for testing AND-gate 100 involves writing a test word (Word 2, Table 6; ex 2, Table 8) to force a "1" at the input pin $Y_OA$ of the AND-gate, and then reading the whole matrix to find that only the status of output pin $Y_OB$ was changed (to "1"), this being recorded as the response (Word 1, Table 6; ex 1, Table 8). This satisfies Steps (1) and (2) of Table 7 above. To complete the testing of AND-gate 100, the additional steps (3) and (4) of Table 7 must be performed, namely, WRITE another test word to force a "0" at the input pin $Y_OA$ of the AND-gate, and READ the whole matrix and find that only the condition of output pin $Y_OB$ was changed to "0," this being recorded as the response word.

The foregoing steps are adequate to test AND-gate 100. Other logical elements to be tested may require more tests involving the application of test stimuli to selected pins, and the reading out of the pin changes in response to such stimuli. At the end of the test, the program includes the special End-of-Test Word, namely Word 7, Table 6 above.

Thus, following the generations of the three words set forth above (Table 8), the test pattern would continue to be built up as follows:

TABLE 9

| 2228 | 2211 | "n" Words | Word | 0006 |
|---|---|---|---|---|
| ex 3 | ex 4 | ex 5 | ex 6 | ex 7 |

From the above description, it will be seen that "ex 3" is a response word (Word 3, Table 6) meaning that pin $Y_OB$ was found to be "0" when the test word of ex 4 (Word 4, Table 6) was inputted into the analyser to force pin $Y_OB$ to "0." The words of "ex 5" and "ex 6" indicate additional response and test words which may be applied with respect to the logic element being tested, and "ex 7" is the special End-of-Test Word (Word 7, Table 6).

It may be that an input pattern word (e.g., ex 6) may create no, or more than one, output pin change ("ex 5"). If this is to be the case, the translated response word (s) would precede the input (test) pattern word.

The complete series of test words is written into the analyser, word-by-word, and with each one the program reads the matrix, produces the response word, and thus creates the stream of words constituting the final test pattern, as shown by the loop in FIG. 13 includng steps 208, 210, 214, 216, 218, and 208.

When the last word has been written and its response recorded, the special End-of-Test word (ex 7) is fed to the analyser, which ends the Generation Mode of Operation (step 212).

The Start and Ready Flip-Flops SRFF are reset, and the READY indicator 88 is extinguished.

The final test pattern generated in the memory of the computer (4, FIG. 1) is transferred to the disc file storage unit 8.

The disc file thus contains a library of the generated test patterns for all the different types of cards to be tested, each test pattern being identified by the part number of the respective card.

The magnetic tape unit 12 in FIG. 1 is used to dump or load each generated test pattern, or the whole library, from the computer memory into the disc file 8. It is also used to dump or load the library of system tapes which contain the generation and execution control programs.

TEST MODE OF OPERATION

GENERAL

As will be recalled from the above description, in the Test Mode the production card to be tested is subjected to the same test stimuli as the reference card was subjected to during the Generation Mode, and the actual responses produced by the production card in the Test Mode are compared to the reference responses produced by the reference card in the Generation Mode, any discrepancies between the actual responses and reference responses indicating a fault in the production card. Actually, there are two Test Modes, one being an Automatic (GO, NO-GO) Test Mode in which the tests are applied serially to the production card and are automatically interrupted upon the uncovering of a fault, the other being a Manual Test (Trouble-shooting) Mode in which tests are selectively applied to locate the fault in the production card.

FIG. 14 is a flow diagram illustrating the Automatic Test (GO,NO-GO) Mode of Operation. If the production card successfully completes all the tests, the PASS light indicator 84 on the control panel 26 (FIG. 5) is energized, and if it fails any test, the testing terminates and the REJECT indicator 86 on the control panel is energized.

The preliminary procedure followed in the Test Mode is substantially the same as in the Generation Mode. The operator inserts the card to be tested (in this case the production card) into connector 44 (FIG. 4b) of the test fixture for making the back-plane pin connections, and inserts the adaptor card AC (FIG. 4a) into connector 46 for making the front-plane pin pin connections. The different voltages required by the card are applied by means of switches 56 (FIG. 4b), and the indicator display 58 on the test fixture indicates to the operator that the card is correctly powered. The operator then presets the Test Counter Switch TCS (FIGS. 5 and 9) to a number equal to or larger than the maximum number of tests made in the Generation Mode; for example, as in the Generation Mode, the operator may merely set the highest digit of the counter to "9" to specify 90,000 tests, which is larger than the number normally required for testing such a card. The operator also presets the Part Number Switch PNS to specify the part number of the production card.

When the operator presses the START button 78 (Step 220, FIG. 14), the program initiates a Part Number Read Operation (Step 222) as described above, this always being the first operation of the program. The part number is thus read out of the analyser via the I/O Word Control Unit 6 to the computer 4, and causes the test pattern for that particular card number to be transferred from disc file 8 to the memory of the computer. Where the test pattern is too long to be transferred at one time, considering the length of the test pattern and also the memory capacity of the computer, it may be segmented by the program. Each string of words may thus be transferred from the disc file to the computer memory (step 224), and from the computer memory to the analyzer (step 226), controlled by the I/O Word Control Unit 6, at the higher transfer speed of, e.g., 250,000 words per second, as indicated earlier.

The next operation involves writing the string of words from the computer memory into the analyzer Flip-Flop Matrix FFM (step 226). As noted above, the example being described includes the five words of Table 6, Word 1 being a response wored specifying the reference or "should be" response to the test stimulus of Word 2, and Word 3 being the reference response to the test Word 4. The fifth word is Word 7 of Table 6, this being a special End-of-Test Word.

Briefly, response Word 1 (Table 6) is first inputted into the Input Register IR (FIG. 7), and its 16 bits are decoded by the decoders (CSD, PSD, CPD and MSD) to fix the "should be" or reference condition of the selected pin on the selected matrix card 22, all as specified in the data bits of Word 1. This is done by setting the "pin" and "comparison" flip-flops of the respective pin, i.e., flip-flop pair FFMb (FIG. 8) for pin $Y_OB$ in our example. The Input Register IR is then cleared, and test Word 2 is then the inputted to apply the appropriate stimuli to the flip-flop pair of the pin and card selected by Word 2, FFMa for pin $Y_OA$ in our example.

The stimulus applied to the "pin" flip-flop of FFMAa conditions it according to the stimulus, and this condition is applied to the input pin of the logic element being tested (pin $Y_OA$ of AND-gate 100, in our example), producing a response in output pin $Y_OB$. The stimulus applied to the "comparison" flip-flop of FFMa conditions it according to the stimulus, but this condition is maintained until the actual comparison test is made.

The test Word 2 also includes the test dat bit D1, which, by setting Test Flip-Flop TFF, causes a comparison to be made between the reference response of word one and the actual response to the test of Word 2. This comparison is effected by the Pin Status Comparator PSC, illustrated in FIG. 8. If the responses match, the test is successful and no ERROR signal is produced on its output line 113. If however the response do not match, the test is unsuccessful and an ERROR signal is produced. The ERROR signal terminates the testing operation and energizes the REJECT indicator 86 on the control panel.

Assuming the test performed by Words 1 and 2 is successfully passed, the system then proceeds to the second test in which the response Word 3 is inputted into the Input Register IR, decoded, and applied to the flip-flop circuit (e.g., FFMb, FIG. 8) of the pin selected by that word to fix its conditions according to the reference response with respect to the test stimulus Word 4. The reference response defined by Word 3 is compared with the actual response produced by inputting the test Word 4; if they match, the test is successfully passed and the operation then proceeds to the next testing step.

In the example described, only the two tests defined by the four steps of Table 7 are applied to the logic element being tested (AND-gate 100), the first test being by Words 1 and 2 and the second test being by Words 3 and 4; therefore after Word 4, the special End-of-Test word (Word 7) is applied to terminate the test for that particular logic element.

Write String of Test Pattern Words (Step 226, FIG. 14)

In the simple example being described for testing AND-gate 100, the test pattern is five words long, consisting of Words 1, 2, 3, 4 and 7 of Table 6 above. Each WRITE cycle transfers one word to the analyzer Flip-Flop Matrix FFM (FIG. 7), in the following manner, reference being made particularly to the timing diagrams of FIGS. 12 and 12a:

With respect to response Word 1 ("2220", Table 6) the I/O Word Control Unit 6 sends the WRITE level during the SC=03 sequence (WT2, FIG. 12). This sets the Read/Write Flip-Flp RWFF for WRITE status (WT9, FIG. 12b) on the next I/O clock (WT1, FIG. 12).

As pointed out earlier, in the Automatic (GO, NO-GO) Test Mode, the SC=05CLK clock (WT3) does not increment the Decimal Counter DC (FIG. 7) because the Validity Flip-Flop VFF remains reset after the start sequence. The first and the following SC=05C3 clocks are unused. As shown by WT5, the 16 Write Lines WL are gated to the analyser between time t6 of that Write Cycle and time t1 of the next Write Cycle (WT1, FIG. 12). The 16 bits of data of Word 1 are transferred to the Input Register IR (FIG. 7) at the trailing edge of the TRIFCLK clock (WT6), as shown by timing WT12, FIG. 12b. Since the test bit D1 is absent from Word 1 (see Tables 6 and 4) the Test Flip-Flop TFF (FIG. 7) is not set by the next SC=05CLK clock, and therefore the COMPARISON ENABLE signal on line 128, FIG. 8, is "0".

The 16 data bits of Word 1 ("2220") transferred to the Input Register IR are decoded as follows:

The "A" bits are decoded by Card Select Decoder CSD to specify the $Y_O$ card, (per Table 2 above) by producing a "1" on line 120 (FIGS. 7 and 8); the "B" and "C" bits are decoded by the Pin Select Decoder OSD to specify the "B" pin (per Table 3 above) by producing a "1" on B Pin SEL. line 121b (FIG. 8); the "D" bits are decoded (per Table 4 above) to specify the K-mode of the "pin" flip-flop pair, by produing a "1" on line 124 (KP) (FIG. 8), and to specify the J-mode of the "compare" flip-flop pair, by producing a "1" on line 124 (JC).

As indicated above, since the test bit D1 is absent from the decoded Word 1, the Error flip-Flop EFF remains reset, and therefore the signal on the COMPARISON ENABLE line 128 of FIG. 8 is "0." When Error Flip-Flop EFF is reset, the SC=05C3 clock is allowed to become the matrix clock applied on line 129 of FIG. 8 to enable gate G1. This matrix clock, however, is applied only to the flip-flop pair FFMB for the $Y_OB$ pin, since only gate G3 is enabled by the "1" signal on the "B" pin select line 121b, gate G2 (for flip-flop pair FFMa) being disabled by the "0" on the "A" pin select line 121a.

The "pin" flip-flop of the $Y_OB$ pair FFMb is in the reset condition (P = "0"), which condition is transferred (for the moment) via buffer B2 and restorer R2 to the Bo input of the Pin Status Comparator PSC. The "compare" flip-flop of the $Y_OB$ pair FFMb is in the set condition (H="1"), but this condition is not yet transferred to Pin Status Comparator PSC because gate G9 is disabled for the moment. The foregoing are shown by timings WT13 and WT15 in FIG. 12b.

Word 2 (test stimulus Word "2217", Table 6) is transferred by the Write Lines WL to the Input Register IR of the analyzer during time WT5 (FIG. 12) at the end of the second WRITE cycle, between I/O Clock t6 and t1, respectively, this transfer being clocked by TRIFCLK (WT6).

Word 2 is decoded as follows: The "A" bits are decoded by Card Select Decoder CSD to select the $Y_O$ card by applying a "1" on select line 120 (FIGS. 7, 8); the "B" and "C" bits are decoded to select the "A" pin, by applying a "1" on select line 121a (FIG. 8); and the "D" bits are decoded to select the J-mode of both the "pin" and "compare" flip-flops i.e., by producing a "1" on line 124 (JP) and on line 124 (JC), FIG. 8. In addition, the test bit D1 is present in decoded "7" of the test word (see Table 4), which causes the third SC=05CLK clock (WT3) to set the Test Flip-Flop (WT16, FIG. 12b) to produce a "1" on COMPARISON ENABLE line 128 of FIG. 8.

Only the flip-flop pair FFMa for the $Y_OA$ pin is enabled by Word 2, by the third SC=05C3 clock (WT4, FIG. 12), since only gate G2 is enabled by the "1" on the "A" pin select line 121a, gate G3 being disabled by the "0" on the "B" pin select line 121b.

Thus, as a result of Word 2, the "pin" flip-flop of FFMa is set (P="1"), and the "comparision" flip-flop of FFMa is also set (H="1").

The "1" from the "pin" flip-flop of FFMa is applied via buffer B1 to terminal $Y_O$ A of AND-gate 100, to restorer R1 and to the "B1" input of the Pin Status Comparator PSC. The "1" from the "comparison" flip-flop of FFMa is applied to gate G8, which is enabled by the "1" on the COMPARISON ENABLE line 128, so that the "1" is transferred to terminal A1 of the Pin Status Comparator PSC.

As described earlier, as a result of writing word 1, restorer R2, in circuit with the "pin" flip-flop of $Y_OB$ pair FFMb reflects the condition of the "pin" flip-flop, which was "0" in the Word 1 example described above. However, as a result of writing Word 2, the output of restorer R2 is changed to reflect the condition of the output pin $Y_OB$ of AND-gate 100 being tested, since the restorer is connected to pin $Y_OB$.

If AND-gate 100 is performing properly, the signal inputted to restorer R2 should be the same as the signal inputted to restorer R1 from the $Y_OA$ pin of the AND-gate; i.e., when the input pin $Y_OA$ is "1,"the output pin $Y_OB$ should also be "1,"and when the input pin $Y_OA$ is "0"the output pin $Y_OB$ should also be "0", as described above. However, if AND-gate 100 is not performing correctly, the input to restorer R2 will not be the same as the input to restorer R1.

Accordingly, two possibilities are to be considered, namely:

(1) the successful or GO possibility, in which AND-gate 100 is performing correctly; and (1) the unsuccessful or NO-GO possibility, in which the AND-gate is not performing correctly. Both possibilities are described below.

Successful GO Test

In this case, AND-gate 100 being tested is correctly performing its function, so that when a "1" is applied to its input pin $Y_OA$, a "1" appears on its output pin $Y_OB$, and when a "0" appears on input pin $Y_OA$, a "0" appears on its output pin $Y_OB$ (see Table 7 above).

Considering the first of the above two tests, which occurs as a result of inputting Word 2, a "1" appears at pin $Y_OB$, and this "1" is transferred via restorer R2 to input Bo of the Pin Status Comparator PSC. Input terminal Ao of PSC also receives a "1" from the "comparison" flip-flop of FFMb. The latter "1" was produced as a result of Word 1, and is transferred by Word 2 via gate G9 which is enabled by the "1" on COMPARISON ENABLE line 128 (by the D1 test bit of Word 2) as described earlier. Thus, at the end of Word 2, the two input terminals Ao and Bo of stage $Y_OB$ of the Pin Status Comparator PSC both carry a 37 1".

At the end of Word 2, the two input terminals A1 and B1 of stage $Y_OA$ of the Pin Status Comparator PSC also carry a "1". Terminal A1 reflects the status ("1") of the "comparison" flip-flop of pair FFMa for the $Y_OA$ pin as a result of gate G8 being enabled by the "1" signal on line 128; and terminal B1 reflects the status of the "pin" flip-flop of pair FFMa, this status being transferred via buffer B1 and restorer R1 as a result of writing Word 1.

As described earler, the Pin Status Comparator PSC includes two separate adder/subtractor circuits, one being for the $Y_OA$ pin and the other being for the $Y_OB$ pin. The "common mode control" and the "carry" inputs are not used, so that the two circuits of PSC are always performing binary addition in their respective stages, producing a Sum output (S) and a Propagate output (P) both of which have an EXCLUSIVE-OR relationship to the two inputs of their respective stages. Thus, if the inputs of B1 and A1 are both "1" or "0" is produced at both the output terminals P1, S1; whereas if one of the input terminals is a "0" and the other a "1," a "1" is produced at both output terminals P1, S1. The same applies with respect to the lower stage input terminals Bo, Ao, and the respective output terminals Po, So.

Accordingly, if AND-gate 100 is performing correctly, the "1" on its input terminal $Y_OA$ forces a "1" on its output terminal $Y_OB$. Thus, the inputs to both the B1 and Bo terminals of the Pin Status Comparator PSC would be "1," as described above. As also described above, the input to its A1 terminal is a "1" by virtue of the "set" condition of the "comparison" flip-flop of the $Y_OA$ pair FFMa; and the input to its Ao terminal would also be a "1" by virtue of the "set" condition of the "comparison" flip-flop of the $Y_OB$ pair FFMb.

Accordingly, output terminals S1, So, would both carry a "0" signal, indicating "no error" with respect to the $Y_OA$ and $Y_OB$ pins.

The Sum output (S) of the Pin Status Comparator PSC for all 25 pins are OR-wired together, so that if an "Error" appears in any one, an ERROR signal appears on line 113. In this case, there is no such ERROR signal on line 113 from any of the Pin Status Comparators PSC.

The Propagate output (P) terminals of the Pin Status Comparators PSC are connected to their respective indicators 60 (FIG. 6) on the control panel 26. This is to enable the pins "in error" to be displayed, as will be described below. In this case, however, no pins are in error since the Propagate output lines (e.g., B1, Bo) all carry "0."

As indicated earlier, whenever the Test Flip-Flop TFF is set, the SC=05C3 clock increments the Test Counter TC (FIG. 7). Accordingly, Word 2, which includes the D1 test bit causing the Test Flip-Flop TFF to be set, also causes the SC=05C3 clock to increment the Test Counter TC one unit.

Word 3 (response word "228," Table 6) is then transferred into the Input Register IR at the end of the third WRITE cycle, as shown by WT12, FIG. 12b. The next SC=05CLK clock (WT3) does not set the Error Flip-Flop EFF (FIG. 7) as there is no error in any of the flip-flop pairs of the Flip-Flop Matrix FFM. However, this clock does reset the Test Flip-Flop TFF (WT16, FIG. 12b) and thereby disables the comparison (ie., forces a "0" on COMPARISON ENABLE line 128, FIG. 8) since the test bit D1 is not present in Word 3.

Word 3 is decoded in accordance with Tables 2–4, to specify card $Y_0$ (bits "A"), pin "B" (bits "B" and "C"), and the reset condition of both the "pin" and "comparison" flip-flops of the pair FFMb for pin $Y_0B$. The two flip-flops are reset after the next SC=05CR clock (WT4) as shown by timings WT13 and WT15, FIG. 12b.

Word 4 (test-stimulus word "211") is transferred into the Input Register IR at the end of the fourth Write Cycle. This word is decoded to specify that both the "pin" and "compare" flip-flops of pair FFMa for pin $Y_0A$ are to be reset (Table 2-4), and also that the Test Flip-Flop TFF is to be set, since it contains the test bit D1. Accordingly, the next SC=05CLK clock sets the Test Flip-Flop TFF, which thereby produces a "1" on the COMPARISON ENABLE line 128 of FIG. 8, to execute the comparison as in the case of Word 2 described above.

The "pin" and "compare" flip-flops of the pair FFMa for the $Y_0A$ pin are reset after the next SC=05C3 clock (WT4), as shown by timings WT13 and WT15, FIG. 12b. The comparison is made by the Pin Status Comparator PSC following the inputting of test-stimulus Word 4. In this case, the outputs of both the "pin" and the "comparison" flip-flops of the pair FFM$a$ for pin Y$_0$A are "0" (P="0"; H="0"), and therefore the Y$_0$A input terminals A1, B1 of the Pin Status Comparator PSC will both be "0".

Similarly, the output of the "comparison" flip-flop of pair FFM$b$ for pin Y$_0$B will also be "0" (H="0"), and therefore input pin A$o$ of Pin Status Comparator PSC will be "0." Also, since AND-gate 100 being tested is performing properly in this example, a "0" will be produced on output pin Y$_0$B of that gate (by the "0" on its input pin Y$_0$A), and therefore a "0" is transferred via restorer R2 to input terminal B$o$ of the Pin Status Comparator PSC.

Thus, in this example all the input terminals of the Pin Status Comparator PSC carry a "0." Accordingly, the two Sum outputs (S1, S$o$) will be "0," thereby signifying "no error" to line 113. Similarly, the two Propagate outputs (P1, P$o$) also carry a "0," and therefore the light indicators 60 on the control panel 26 for these two pins will not be energized.

Word 4, since it includes the test bit D1 which sets the Test Flip-Flop TFF, causes the SC=05C3 clock to increment the Test Counter TC one unit.

Word 7 is then transferred into the Input Register IR at the end of the fifth Write Cycle. This is the End-of-Test Word, and is decoded to set the End-of-Sequence Flip-Flop ESFF (FIG. 7) to send the C14L level signal (WT14, FIG. 12$b$) to the I/O Word Control Unit 6.

The I/O Word Control Unit 6 goes into its SC=14 sequence and then into its SC=15 sequence, at which time the analyser receives the General Clear (GCLR) signal on line 104 (FIG. 7). This resets the Start and Ready Flip-Flop SRFF, which extinguishes the READY indicator 88 and the Test Indicator 92 (FIG. 5) on the control panel 26, and energizes the PASS indicator 84 on the control panel to inform the operator that the test has been successfully completed.

Unsuccessful No-Go Test

In this case, the AND-gate 100 being tested is defective, such that a "1" applied to its input terminal Y$_0$A produces an erroneous "0" at its output terminal Y$_0$B, rather than a correct "1," as in the previous example.

In this unsuccessful "NO-GO" case, inputting of Word 1 will produce the same result as in the previously-described correct case, but inputting Word 2 will produce a "0" via restorer R2 to input terminal B$o$ of the Pin Status Comparator PSC rather than a "1" as in the previous correct case. Since the Sum output terminals (S1, S$o$) and the Propagate output terminals (P1, P$o$) of the Pin Status Comparator PSC bear an EXCLUSIVE-OR relationship to their respective input terminals, a "1" will be produced on both output terminals S$o$ and P$o$.

The "1" on output terminal S$o$ appears on line 113, producing an ERROR signal on that line. This ERROR signal is fed to the Error Flip-Flop EFF (FIG. 7). Word 3 is nevertheless transferred into the Input Register IR at the end of the Write Cycle.

After a stability time (WT17, FIG. 12$b$) which depends on the delay involved in the circuitry of the card under test, the SC=05CLK strobes this error, and sets the Error Flip-Flop EFF. The SC=05C3 clock (WT4) does not reach the matrix when the Error Flip-Flop is set, and therefore Word 3 has no effect on the matrix.

As mentioned earlier, all the Sum outputs (S) of the Pin Status Comparator PSC are OR-wired to line 113 so that an "error" in any one will produce the ERROR level on line 113.

When the ERROR level is present on line 113, a signal is applied via line 160 (FIG. 7) to the End-of-Sequence Flip-Flop ESFF. This produces the C14L level to the I/O Word Control Unit 6, as shown by the broken lines in timing WT14, FIG. 12$b$. The I/O Word Control Unit 6 then goes into its SC=14 and SC=15 sequences, and the analyzer receives the General Clear (GCLR) level via line 104 to reset the Start and Ready Flip-Flops SRFF. The READY indicator 88 and the TEST indicator 92 on the control panel 26 (FIG. 5) are extinguished. In addition, setting the Error Flip-Flop EFF causes, the REJECT indicator 86 to be energized via line 162 (FIG. 7).

The Test Counter TC having been incremented one unit by the SC=05C3 clock when Word 2 was inputted (by the fact that the Test Flip-Flop TFF was set by the test bit D1, as described earlier), the Test Counter displays the number of tests which have been performed before this error is encountered. This is helpful to the operator in making the Manual Test for trouble-shooting the error as described below. Also helpful in trouble-shooting the error is the fact that a "1" appears on the Propagate output terminal P$o$ of the Pin Status Comparator PSC, which energizes the indicator light 60 for the Y$_0$B pin on the control panel when the Display Error push button on the control panel is depressed.

Manual Test (Trouble-shooting) Mode of Operation

As described earlier, the analyser stops when the first error is detected. The Test Counter Display 74 on the control panel shows the number of tests performed before the error was encountered, and the indicator light 60 for the respective pin where the error occurred is energized by depressing the Display Error Push Button 80, as also described above.

The operator has before him the logic schematic of the card under test, and the listing of the complete test pattern. He may therefore find in the listing the last input pin change or the last clock pulse before the occurrence of the error. If necessary, he may preset the Test Counter Swich TCS on the control panel 26 (FIG. 5) and hit the START button 78 again to stop the test when the Test Counter TC has reached the preset value. He may also manually change the logic status of any pin of the matrix from the control panel, by Card Selector Switch 62 and Pin Selector Switch 64 to select the specific one of 200 pins, and by push-buttons 66 and 68 to specify the status of each pin; push-button 66 specifies a "1" (true) condition, and push-button 68 specifies a "0" (false) condition.

The operator may also send one clock pulse to the card, by depressing the Single Pulse Push Button 82 on the control panel. A "one shot" clock may also be applied under computer control by using a special word, such as that shown in Table 5 above.

If the operator wishes to test a special part of the circuitry, he may have to reset all the logic conditions which existed after the error was detected. For this purpose, he can depress the CLEAR button 76 (FIG. 5) on the control panel which forces a "1" on line 123 (FIG. 8) to clear all the flip-flop pairs of the analyser Matrix, the flip-flops being reset (to "0") with a clock applied on line 122 of FIG. 8. Clearing all the flip-flops may also be effected during the normal operation of the apparatus by the use of a special word, as set forth in Table 5.

When the fault is located and repaired, the operator proceeds to complete the remainder of the test (from the beginning) until the energization of the PASS light indicator 84 on the control panel informs him that the card has successfully passed all the tests and therefore conforms to the master card.

While the invention has been described with respect to a particular embodiment thereof, it will be appreciated that many variations, modifications and other applications of the described embodiment may be made.

What is claimed is:

1. Modular electrical testing apparatus for circuit units having a plurality of connector terminals, comprising:
   (A) connector means for engaging terminals of either a reference circuit unit known to be without faults or a production circuit unit to be tested for faults;
   (B) means enabling said electrical testing apparatus to be operated in accordance with a Generating Mode and a Test Mode;
   (C) reference pattern generating means effective during said Generation Mode for generating a digital coded reference pattern from said reference circuit unit, said reference pattern generation means comprising:
     (i) application means for sequentially applying a series of preselected digital coded test stimuli to a selected terminal of a reference circuit card engaged in said connector means;
     (ii) means for scanning all of said terminals engaged in said connector means for each said application of said test stimuli to each of said terminals of said reference circuit unit;
     (iii) means for sensing a change in logic state of each of said scanned reference unit terminals and for identifying said terminals having a changed logic state as a result of said application of said test stimuli; and
     (iv) means for designating a part of reference code corresponding to said reference circuit unit
   (D) means for recording said test stimuli applied to each of said reference circuit unit terminals, said identified terminals having changed logic states, said logic state of each of said identified terminals, and said part reference code of said reference circuit unit; and
   (E) testing means effective during said Test Mode for testing said production circuit unit, said testing means comprising:
     (i) means for inputting a desired part reference code of said production circuit unit;
     (ii) means for selecting said recorded reference pattern corresponding to said desired part reference code;
     (iii) means for sequentially applying said test stimuli associated with said selected reference pattern to said terminals of said production circuit unit;
     (iv) a plurality of paired first and second flip-flop devices, each pair of said flip-flop devices being associated with a terminal of said production circuit unit and wherein said first flip-flop of said pair is connected to a terminal of said production circuit unit being tested and said second flip-flop of said pair is connected to said application means, and wherein said first flip-flop is effective to store an indication of a logic state change of its corresponding production unit terminal in response to said application of said test stimuli, and wherein said second flip-flop is effective to store an indication of an expected logic change of said terminal associated with said flip-flop pair as a result of said application of said recorded test stimuli, and wherein said plurality of paired flip-flop devices are disposed on one or more modular circuit cards for insertion into said electrical testing apparatus;
     (v) means for comparing said stored logic states of said plurality of flip-flop pairs; and
     (vi) means for indicating a fault in said production circuit unit being tested when a mismatch between any of said compared flip-flop logic states is present.

2. Apparatus according to claim 1, and further including means effective during said test mode for automatically terminating operation of said testing means in response to a mismatch condition being indicated by said comparison means.

3. Apparatus according to claim 1 and further including means for initializing said plurality of paired flip-flop devices prior to the application of said test stimuli to said terminals of said production circuit unit during said test mode.

4. Apparatus according to claim 1 and further including means effective upon the inputting of each test stimulus to a circuit unit input terminal during both said Generation and said Test Modes for setting both corresponding flip-flops of said input terminal in the binary state specified by the test stimulus.

5. Apparatus according to claim 1, wherein said flip-flop comparison means includes a plurality of terminal status comparators, each having a pair of inputs, one for each of the two flip-flop outputs of a respective terminal, the output of each of said comparators having an EXCLUSIVE-OR relationship to the inputs thereof.

6. Apparatus according to claim 1 and further including a plurality of light indicators, each associated with a particular terminal of said production circuit unit and wherein the output of each of said comparison means is connected to the indicator of its respective terminal for indicating the status thereof.

7. Apparatus according to claim 1 wherein the outputs of said comparison means are OR-wire to a common error line.

8. Apparatus according to claim 1 and further including means enabling manual testing of the terminals, comprising presetting means for presetting the flip-flop pairs of the terminals individually to preselected states.

9. Apparatus according to claim 8 wherein said means enabling manual testing further includes a presettable test counter for presetting the apparatus to automatically stop at a specified test number.

10. Apparatus according to claim 1 wherein said test stimuli comprise a plurality of digital words, said digital words specifying logic-oriented tests for application to said terminals of said production circuit unit by said application means, said digital words further indicating said expected logic change of said terminals associated with said flip-flop pairs.

11. Apparatus according to claim 10 wherein said digital words further include words for designating one or more of said modular circuit cards for selection by said application means.

* * * * *

UNITED STATES PATENT AND TRADEMARK OFFICE
CERTIFICATE OF CORRECTION

PATENT NO. : 4,097,797

DATED : June 27, 1978

INVENTOR(S) : Michel Finet

It is certified that error appears in the above-identified patent and that said Letters Patent are hereby corrected as shown below:

Col. 1, line 44, "conventionaly" should be --conventionally--.
Col. 5, line 14, "illutrated" should be --illustrated--; line 58, "Altoghether" should be --Altogether--; line 63, "thee" should be --there--. Table 3, line beginning "C Bits" should read
--C Bits 8 0 0 0 0 0 0 0 1 1 0 0 0 0 0 0 1 1 0 0 0 0 0 0 1 1 --.
Col. 11, line 11 "TABLE A" should be --TABLE 4--; first line in body of same table should read --0 000 0 Reset an input pin 0 1 0 --; line 41, "0003" should be --∅003--; line 42, "0004" should be --∅004--; line 43, "0006" should be --∅006--; line 48, delete "stimulus, since the"; TABLE 6, the line beginning "4D BITS ∅" should begin --4D BITS 0--. line 20 "FFW" should be --FFM--; line 23 "FFW" should be --FFM--; line 26 "TTF" should be --TFF--. Col. 15, line 60 "129" should be --128--. Col. 17, line 14 "EXCLUSION-OR" should be --EXCLUSIVE-OR--; line 27, after " "S" " insert --carry--; line 44 "Lins" should be --Lines--. Col. 18, line 27 "PBS" should be --PNS--. Col. 19, line 18 "Commparison" should be --Comparison--. Col. 20, line 5 "1lines" should be --lines--; line 11 "11b" should be deleted and --operation-- inserted therefor; line 23, "Operaion" should be --Operation--; line 43, "SC=04C3" should be --SC=05C3--; line 44, "119" should be --129--. Col. 22, line 10 "Operaton" should be --Operation--. Col. 25, line 42 "generally" should be --general--. Col. 30, line 24, "2220" should be --2∅2∅--, and "2217" should be --2∅17--. Col. 31, line 13 "2228" should be --2∅28--, "2211" should be --2∅11--, and "0006" should be --∅006--; line 32, "includng" should be --including--.

UNITED STATES PATENT AND TRADEMARK OFFICE
CERTIFICATE OF CORRECTION

PATENT NO. : 4,097,797  
DATED : June 27, 1978  
INVENTOR(S) : Michel Finet

It is certified that error appears in the above-identified patent and that said Letters Patent are hereby corrected as shown below:

Col. 32, line 54 "wored" should be --word--. Col. 33, line 50, " "2220" should be --"2220"--; line 53, "Flip-Flp" should be --Flip-Flop--. Col. 34, line 4, " "2220" " should be --"2220"--; line 10 "OSD" should be --PSD--; line 38 " "2217" " should be --"2217"--. Col. 35, line 26 "(1)" should be --(2)--; line 47 "37 1". " should be --"1".--; line 56 "earler" should be --earlier--. Col. 36, line 35 "228," should be --"2228"--; line 52 " "211" " should be --"2211"--; Col. 37, line 63 "SC-05CLK" should be --SC-04CLK--.

Signed and Sealed this

Fourteenth Day of August 1979

[SEAL]

Attest:

LUTRELLE F. PARKER

Attesting Officer  Acting Commissioner of Patents and Trademarks